United States Patent
Yin et al.

(10) Patent No.: US 10,050,627 B2
(45) Date of Patent: Aug. 14, 2018

(54) INFORMATION PROCESSING DEVICE, PLD MANAGEMENT PROGRAM, AND PLD MANAGEMENT METHOD

(71) Applicant: FUJITSU LIMITED, Kawasaki-shi, Kanagawa (JP)

(72) Inventors: Fang Yin, Kawasaki (JP); Yasuhiro Watanabe, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/847,978

(22) Filed: Dec. 20, 2017

(65) Prior Publication Data

US 2018/0175861 A1    Jun. 21, 2018

(30) Foreign Application Priority Data

Dec. 21, 2016  (JP) .................................. 2016-248297

(51) Int. Cl.
*H03K 19/177* (2006.01)

(52) U.S. Cl.
CPC ... *H03K 19/17744* (2013.01); *H03K 19/1776* (2013.01); *H03K 19/17756* (2013.01)

(58) Field of Classification Search
None
See application file for complete search history.

(56) References Cited

U.S. PATENT DOCUMENTS

| | | | | |
|---|---|---|---|---|
| 8,284,665 | B1* | 10/2012 | Aybay | H04L 43/026 370/235 |
| 2012/0240185 | A1* | 9/2012 | Kapoor | H04L 63/1425 726/1 |
| 2015/0304441 | A1* | 10/2015 | Ichien | H03M 7/6094 709/247 |
| 2018/0032657 | A1* | 2/2018 | Matsumura | G06F 15/7867 |
| 2018/0046504 | A1* | 2/2018 | Yoneoka | G06F 9/541 |

FOREIGN PATENT DOCUMENTS

| | | |
|---|---|---|
| JP | 2015-231205 | 12/2015 |
| JP | 2016-076867 | 5/2016 |

* cited by examiner

*Primary Examiner* — Jany Richardson
(74) *Attorney, Agent, or Firm* — Fujitsu Patent Center

(57) ABSTRACT

An information processing device includes a processor configured to execute a program; and a programmable circuit device (a PLD hereafter) having a reconfiguration region in which a logic circuit requested in a configuration request from the processor is configured in response to the configuration request. The processor obtains measured values of data transfer rates of a plurality of logic circuits that are configured in the reconfiguration region and are operating; and on the basis of a sum of the obtained measured values of the data transfer rates, adjusts respective parallelisms of the plurality of logic circuits configured in the reconfiguration region, within a range ensuring that a sum of the data transfer rates does not exceed an upper limit of a data transfer rate of a bus provided in the PLD.

13 Claims, 18 Drawing Sheets

FIG.9

| | UC_1 | UC_2 | UC_3 | UC_4 |
|---|---|---|---|---|
| PARALLELISM PL | PL1 | PL2 | PL3 | PL4 |
| PREDICTED CONFIGURATION TIME CT_E | CT_E1 | CT_E2 | CT_E3 | CT_E4 |
| PREDICTED EXECUTION TIME ET_E | ET_E1 | ET_E2 | ET_E3 | ET_E4 |
| PREDICTED USE BANDWIDTH BD_E | BD_E1 | BD_E2 | BD_E3 | BD_E4 |
| MEASURED EXECUTION TIME ET_M | ET_M1 | ET_M2 | ET_M3 | ET_M4 |
| MEASURED USE BANDWIDTH BD_M | BD_M1 | BD_M2 | BD_M3 | BD_M4 |

FPGA BUS BANDWIDTH UPPER LIMIT VALUE BD_L

FIG.15

| | UC_1 | | | UC_2 | | |
|---|---|---|---|---|---|---|
| TIME | t0 | t4 | t7 | t1 | t5 | t6 |
| PARALLELISM PL | 8 | 4 | 9 | 2 | 4 | 0 |
| PREDICTED CONFIGURATION TIME CT_E(ms) | 4 | 2 | 4.5 | 1 | 2 | 0 |
| PREDICTED EXECUTION TIME ET_E(ms) | 100 | 200 | 88.9 | 200 | 100 | 0 |
| PREDICTED USE BANDWIDTH BD_E(MB/sec) | 1000 | 600 | 1350 | 200 | 400 | 0 |
| MEASURED EXECUTION TIME ET_M(ms) | 200 | 200 | 88.9 | 200 | 100 | 0 |
| MEASURED USE BANDWIDTH BD_M(MB/sec) | 1200 | 600 | 1350 | 200 | 400 | 0 |
| PROPORTION RATIO RT OF FPGA OCCUPIED BY USER CIRCUIT | 64% | 32% | 72% | 30% | 60% | 0% |

FPGA BUS BANDWIDTH UPPER LIMIT VALUE BD_L = 1400MB/S

INFORMATION PROCESSING DEVICE, PLD MANAGEMENT PROGRAM, AND PLD MANAGEMENT METHOD

CROSS-REFERENCE TO RELATED APPLICATION

This application is based upon and claims the benefit of priority of the prior Japanese Patent Application No. 2016-248297, filed on Dec. 21, 2016, the entire contents of which are incorporated herein by reference.

FIELD

The present invention relates to an information processing device, a PLD management program, and a PLD management method.

BACKGROUND

A programmable logic device (abbreviated hereafter to PLD) has an integrated circuit in which a plurality of logic circuit elements, memory circuit elements, wires, switches, and so on are formed in advance, and reconfigures the circuit capable of executing a predetermined process, when configuration data for configuring a circuit capable of executing the predetermined process are set in or written to the integrated circuit. This type of PLD is a field programmable gate array (FPGA) or the like, for example, and serves as an LSI in which an internal circuit can be reconfigured to various logic circuits by rewriting configuration data. Hereafter, an FPGA will be described as an example of a PLD.

When a processor causes a dedicated hardware circuit to execute a predetermined software process (a job, for example), a processor set or writes configuration data for configuring the dedicated circuit in an FPGA to configure the dedicated circuit in the FPGA, and then causes the dedicated circuit to execute the predetermined process. Further, when the dedicated circuit completes the predetermined process, the processor set or writes configuration data of another dedicated circuit in the FPGA that executes another process to configure the other dedicated circuit in the FPGA, and then causes the other dedicated circuit to execute the other process. The processor causes a dedicated circuit of the FPGA to execute a predetermined software process, whereby the FPGA acts as an accelerator of the processor. As a result, power saving and improved functionality can be realized in an information processing device (a computer) that includes the processor.

With increases in the scale of FPGAs, it has become possible to configure a plurality of logic circuits in an FPGA and operate the plurality of logic circuits in parallel. It has also become possible to reconfigure the plurality of logic circuits configured in the FPGA dynamically and asynchronously such that the plurality of logic circuits are operated asynchronously in parallel, for example by reconfiguring a part of the plurality of logic circuits and starting to operate the resulting new logic circuits while continuing to operate the plurality of logic circuits.

Configuring a plurality of circuits in an FPGA is disclosed in Japanese Laid-open Patent Publication No. 2016-76867 and Japanese Laid-open Patent Publication No. 2015-231205.

SUMMARY

Meanwhile, when a plurality of users uses an information processing device that has a processor and an FPGA therein, specific processes of programs belonging to the plurality of users are executed respectively by the plurality of logic circuits configured in the FPGA. In this case, the programs implemented by the plurality of users are not aware of the logic circuits relating to each other, and configure the respective logic circuits in the FPGA such that the plurality of configured logic circuits share the FPGA partially and dynamically. As a result, a use bandwidth of a bus between the FPGA and a memory may reach an upper limit of the bus bandwidth such that a bottleneck occurs in the bus bandwidth.

According to one aspect of the embodiment, an information processing device includes a processor configured to execute a program; and a programmable circuit device (a PLD hereafter) having a reconfiguration region in which a logic circuit requested in a configuration request from the processor is configured in response to the configuration request. The processor obtains measured values of data transfer rates of a plurality of logic circuits that are configured in the reconfiguration region and are operating; and on the basis of a sum of the obtained measured values of the data transfer rates, adjusts respective parallelisms of the plurality of logic circuits configured in the reconfiguration region, within a range ensuring that a sum of the data transfer rates does not exceed an upper limit of a data transfer rate of a bus provided in the PLD.

According to the aspect, the occurrence of a bottleneck in the bus bandwidth of the PLD is suppressed.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 9 is a table illustrating parameters of the user circuits managed by the processor.

FIG. 15 is a table illustrating a specific example of a case in which the user circuit parallelism adjustment according to the first embodiment is applied.

DESCRIPTION OF EMBODIMENTS

Figure 1:
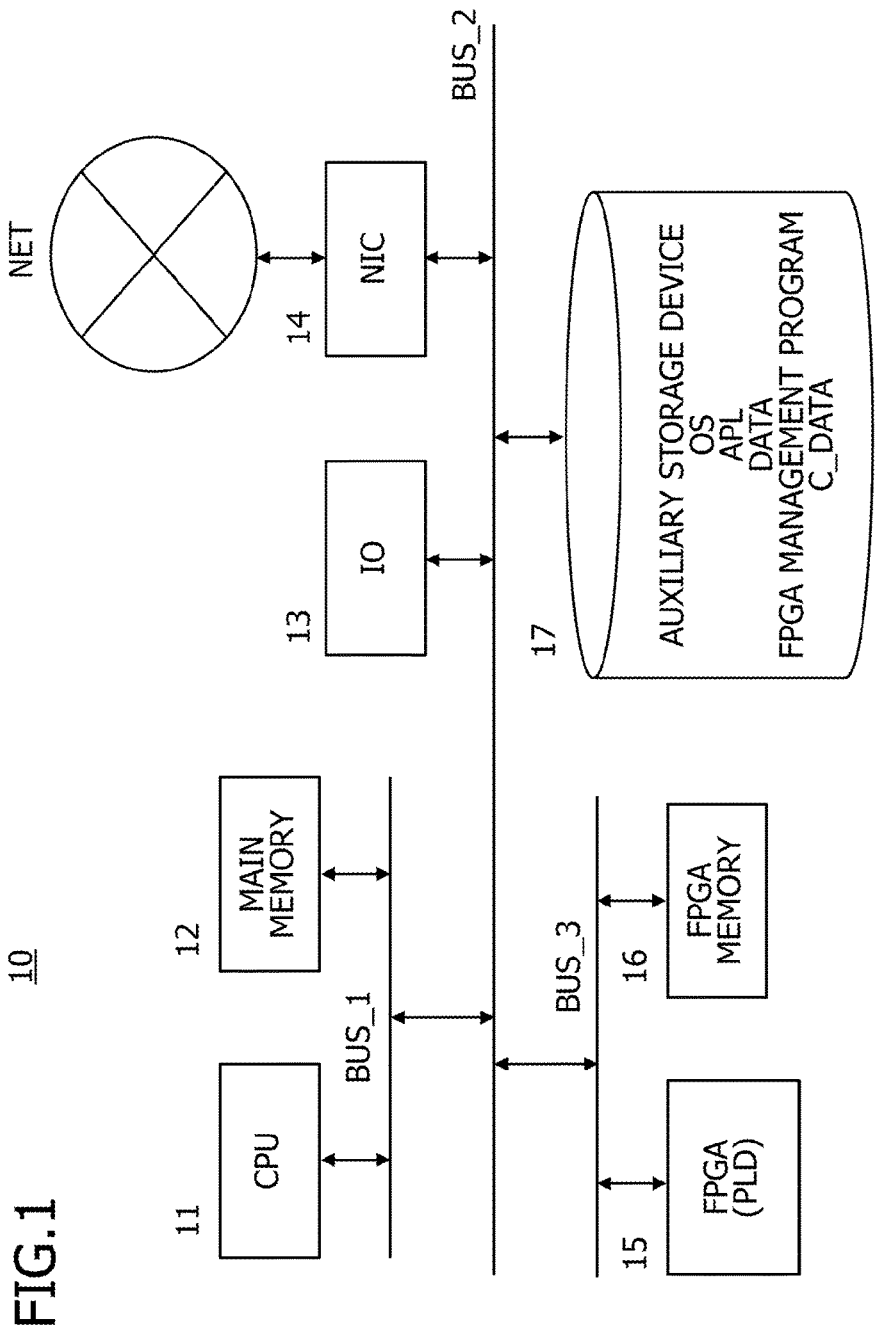
FIG. 1 is a view depicting an example configuration of an information processing device according to an embodiment.

FIG. 1 is a view depicting an example configuration of an information processing device according to an embodiment. A server 10 serving as the information processing device includes a processor or a central processing unit (CPU) 11 that executes an OS, an application program, or a middleware program, and a first bus BUS_1 such as a CPU bus for connecting between the CPU 11 and a main memory 12 such as a DRAM. The server 10 also includes an I/O device 13 such as a mouse, a keyboard, or a display panel, a network interface card (NIC) 14 connected to a network NET, an auxiliary storage device 17 such as a hard disk drive (HDD) or a solid-state drive (SSD) for storing an OS, an application program APL, data DATA, and the like, and so on. These components are connected to the first bus BUS_1 via a second bus BUS_2 such as a PCI bus.

The server 10 further includes a programmable logic device (PLD) 15 that is capable of reconfiguring a desired logic circuit, a memory 16 for storing configuration data of the PLD and so on, and a third bus BUS_3 that serves as a bus for connecting between the PLD and the memory 16. The PLD is an FPGA or the like, for example, while the memory 16 is an FPGA memory and the third bus is an FPGA bus.

For example, when a job management program of the OS executed by the CPU 11 detects a job that can be processed by a logic circuit provided in the FPGA in an application program currently being executed, the CPU writes (or set) configuration data for configuring the logic circuit to the FPGA to configure the logic circuit in the FPGA, and then executes the logic circuit.

An FPGA management program for managing the FPGA and configuration data C_DATA for configuring a logic circuit are stored in the auxiliary storage device 17. When the server 10 is activated, the OS, application APL, and FPGA management program stored in the auxiliary storage device are expanded in the main memory 12 and executed by the processor 11. Further, the configuration data C_DATA in the auxiliary storage device are expanded in the FPGA memory 16.

The FPGA 15 can reconfigure various logic circuits by modifying the configuration data, and therefore, by modifying the configuration data, processes of various jobs can be executed at high speed by logic circuits configured in the FPGA even after manufacture of the server 10.

In a cloud service or the like, a plurality of users cause the server 10 to execute application programs belonging respectively thereto. As a result, the processor 11 of the server 10 executes the application programs of the plurality of users in parallel. Accordingly, logic circuits for executing predetermined processes (jobs) of the respective application programs are configured in the FPGA 15 asynchronously, and the plurality of configured logic circuits (user circuits) operate in parallel to execute the predetermined processes (jobs) respectively.

Figure 2:
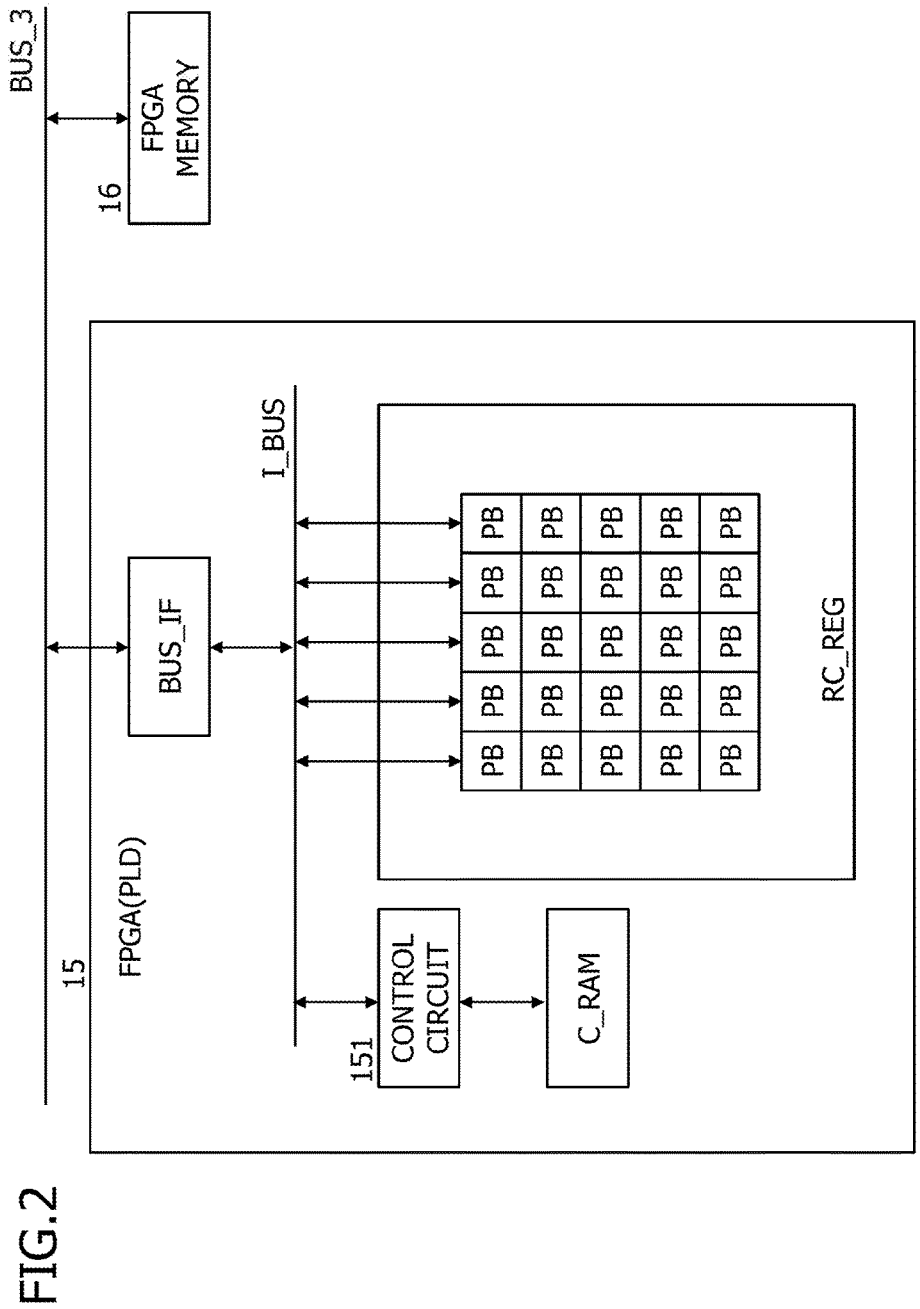
FIG. 2 is a view depicting an example configuration of an FPGA.

FIG. 2 is a view depicting an example configuration of an FPGA. An FPGA 15 depicted in FIG. 2 includes a bus interface circuit BUS_IF provided in relation to the third bus BUS_3 connected to the FPGA, a control circuit 151 for implementing writing control and other control on the configuration data, a configuration data memory C_RAM to which the configuration data are written, a reconfiguration region RC_REG in which various logic circuits are reconfigured in accordance with the written configuration data, and an internal bus I_BUS.

Although not depicted in the figure, a plurality of logic circuit elements, memory circuit elements, wires, switches, and so on are formed in advance in the reconfiguration region RC_REG. Further, the reconfiguration region RC_REG is divided into a plurality of partial reconfiguration blocks PB that are logically or physically divided. Then, using a circuit block that can be provided in each partial reconfiguration block PB as a configuration unit, a reconfigured logic circuit is configured in one or a plurality of the partial reconfiguration blocks. Accordingly, the configuration data memory C_RAM is divided into a plurality of storage areas corresponding to the plurality of partial reconfiguration blocks PB, for example, such that when the configuration data C_DATA are written to a storage area, a logic circuit is configured in the partial reconfiguration block PB corresponding to that storage area.

Furthermore, a logic circuit (a user circuit) for executing a certain job may be configured in a plurality of the partial reconfiguration blocks PB. In this case, the configuration data for configuring the logic circuit are written respectively to the storage areas corresponding to the plurality of partial reconfiguration block areas such that the logic circuit (the user circuit) for executing the process of the job is configured by a plurality of circuits configured in the respective partial reconfiguration blocks.

As described above, the reconfiguration region RC_REG in the FPGA is configured by the plurality of partial reconfiguration blocks PB. Further, the logic circuits for executing predetermined processes (jobs) of the application programs belonging to the respective users may each be configured either in a single partial reconfiguration block PB or a plurality of partial reconfiguration blocks PB.

The logic circuits configured in the reconfiguration region RC_REG receive input data from the CPU and output process results obtained in relation to the input data to the CPU via the bus interface BUS_IF. Further, the plurality of logic circuits configured in the reconfiguration region RC_REG transmit and receive data to and from the FPGA memory 16 during an operation via the internal bus I_BUS, the bus interface BUS_IF and the FPGA bus BUS_3.

Figure 3:
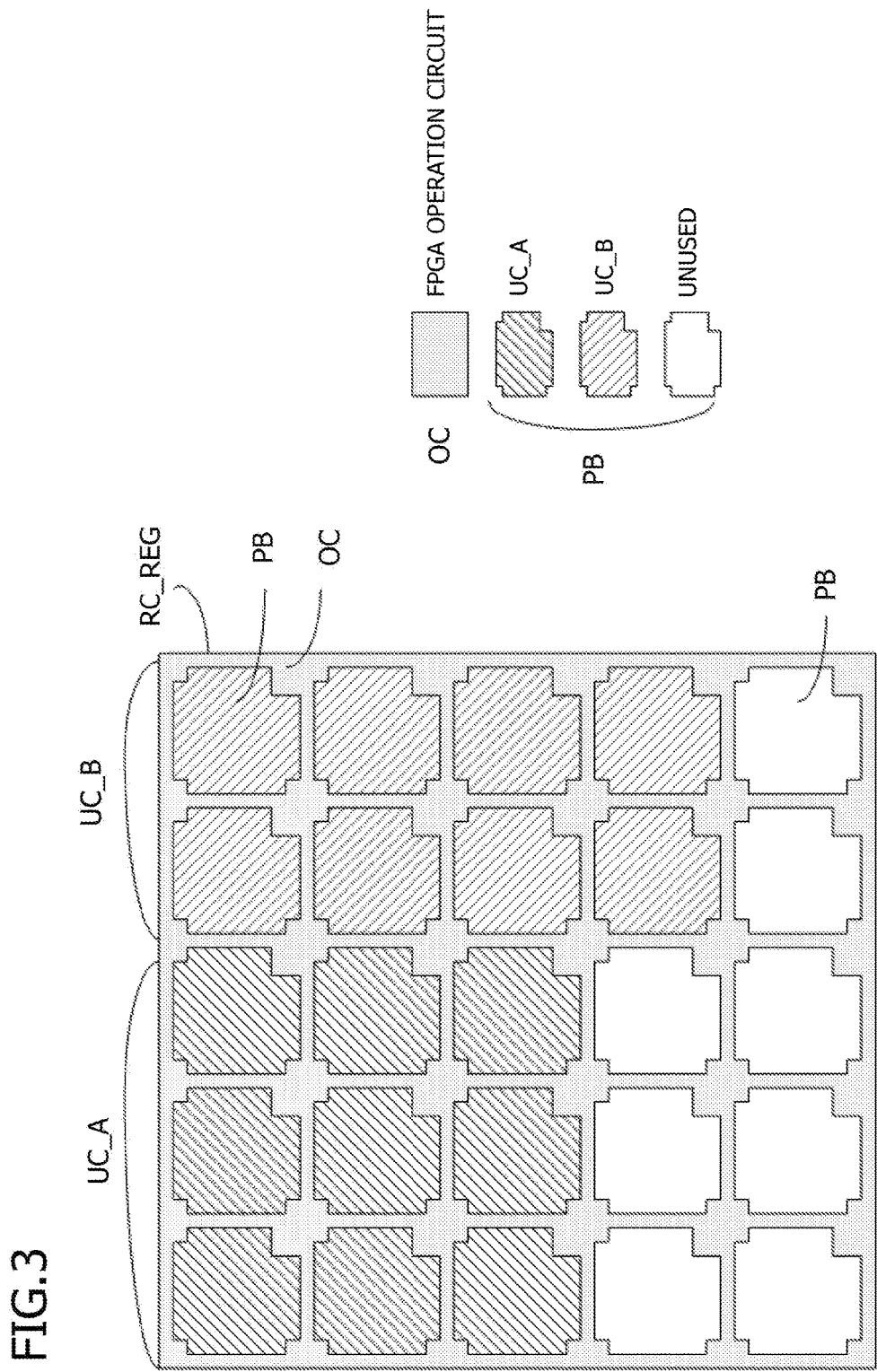
FIG. 3 is a view depicting an example of the reconfiguration region of the FPGA.

FIG. 3 is a view depicting an example of the reconfiguration region of the FPGA. As depicted in FIG. 2, the reconfiguration region RC_REG is divided into the plurality of partial reconfiguration blocks PB, which are disposed in matrix form. Further, the reconfiguration region RC_REG includes an operation circuit OC for transferring data between the plurality of logic circuits configured in the plurality of partial reconfiguration blocks PB, and transferring data between the bus interface BUS_IF of FIG. 2 and the logic circuits configured in the partial reconfiguration blocks PB. The operation circuit OC includes a network wire, a network switch, a routing circuit, and so on.

In the example of FIG. 3, a logic circuit UC_A belonging to a user A is configured by a circuit configured in 3×3 partial reconfiguration blocks PB on the left side of the plurality of partial reconfiguration blocks PB, and a logic circuit UC_B belonging to a user B is configured by a circuit configured in 4×2 partial reconfiguration blocks PB on the right side. Further, the eight partial reconfiguration blocks PB in which a circuit is not configured are left unshaded.

Figure 4:
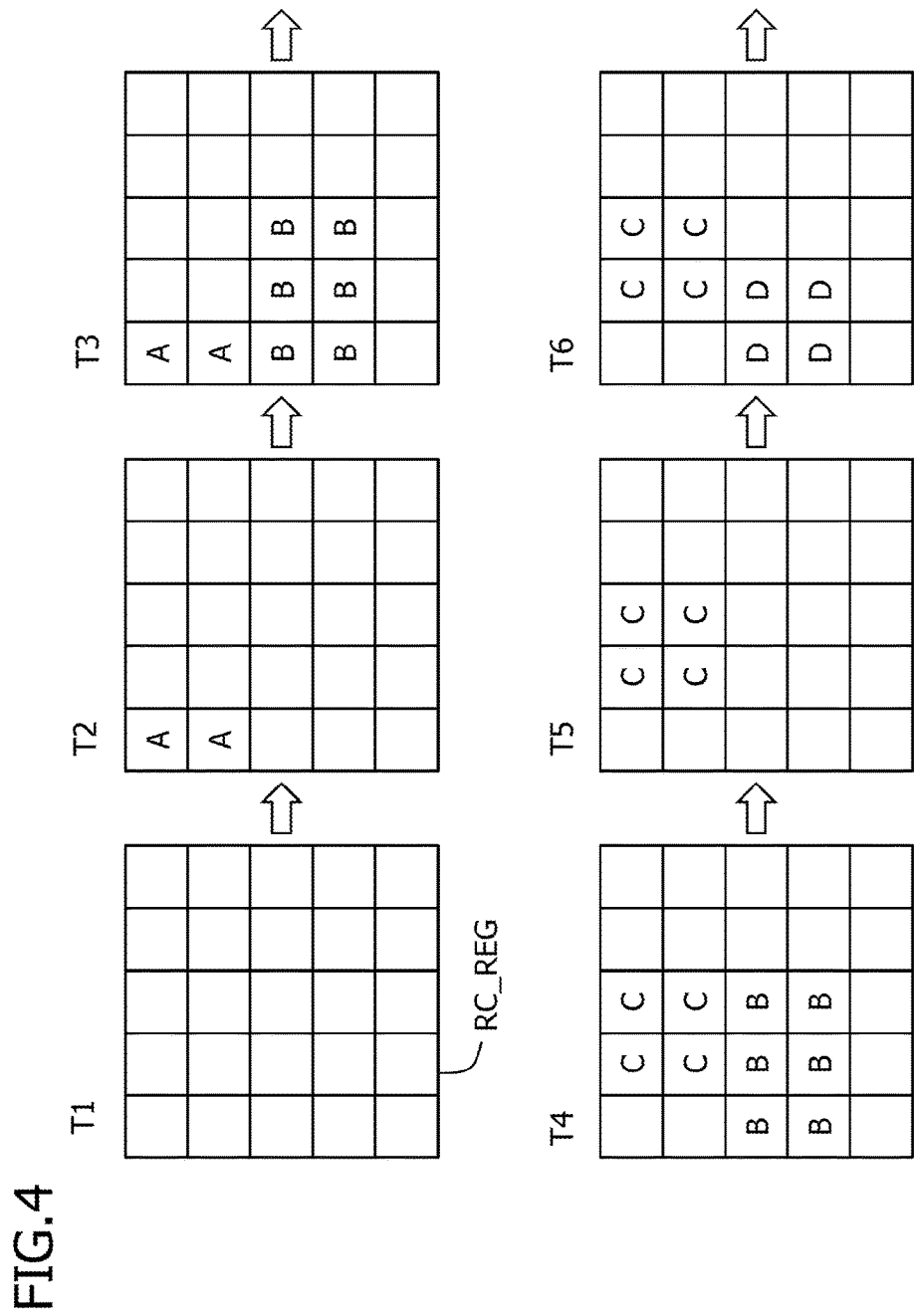
FIG. 4 is a view illustrating an example in which logic circuits belonging to a plurality of users are configured dynamically and then deleted.

FIG. 4 is a view illustrating an example in which logic circuits belonging to a plurality of users are configured dynamically and then deleted. At a time T1, no logic circuits are configured in the reconfiguration region RC_REG of the FPGA. Next, at a time T2, a logic circuit of a user A is configured in two partial reconfiguration blocks and starts to execute a job. Next, at a time T3, a logic circuit of a user B is configured in six partial reconfiguration blocks and starts to execute a job. Following the time T3, the logic circuit of the user A completes processing, and at a time T4, a logic circuit of a user C is configured in four partial reconfiguration blocks and starts to execute a job. Next, at a time T5, the logic circuit of the user B completes processing, and at a time T6, a logic circuit of a user D is configured in four partial reconfiguration blocks and starts to execute a job. When each configured logic circuit completes processing, the partial reconfiguration blocks in which the logic circuit is configured are released, for example, so that another logic circuit can be configured therein. In this case, for example, the configuration data in the configuration data memory C_RAM are not deleted until another logic circuit is configured in the released partial reconfiguration blocks so that when a request is issued to configure the same logic circuit again, the configured logic circuit is activated.

As depicted in FIG. 4, different logic circuits belonging to the same user or different users are configured asynchronously in the reconfiguration region of the FPGA, and the configured logic circuits execute jobs. The FPGA management program provided in the server 10 controls reconfiguration of the logic circuits in the FPGA.

Figure 5:
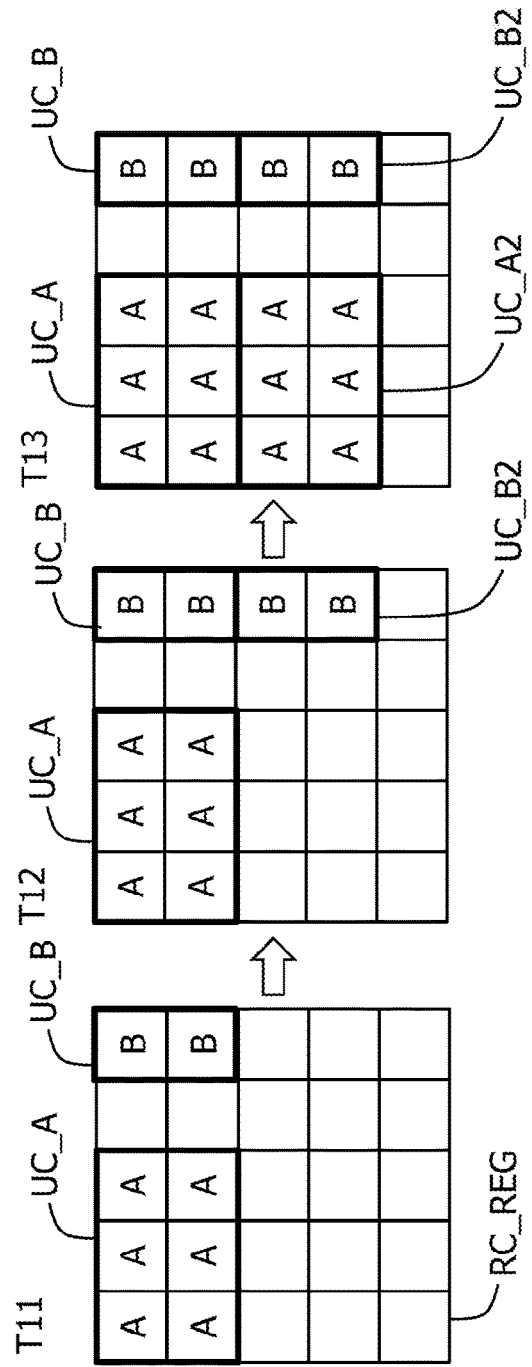
FIG. 5 is a view depicting an example of parallelism control implemented on the logic circuits configured in the FPGA.

FIG. 5 is a view depicting an example of parallelism control implemented on the logic circuits configured in the FPGA. A logic circuit is configured in an FPGA, which is a type of PLD, by setting configuration data, whereupon the logic circuit executes a job. The FPGA thus functions as a CPU accelerator. However, the logic circuit in the FPGA is configured as a lookup table or a switching circuit reconfigured in accordance with the configuration data, and therefore has a lower operation speed than a normal custom integrated circuit. Hence, configuring a plurality of identical logic circuits in the FPGA and operating the plurality of logic circuits in parallel may be considered as a method of using the logic circuits in the FPGA as a CPU accelerator.

For example, when the processor that executes the FPGA management program configures a logic circuit for executing a process of a certain job in the FPGA and space is available in the reconfiguration region RC_REG, the processor controls the FPGA to configure a plurality of identical logic circuits and cause the plurality of identical logic circuits to execute the job in parallel.

In the example of FIG. 5, at a time T11, the processor that executes the FPGA management program configures the logic circuit UC_A of the user A in six partial reconfiguration blocks, and configures the logic circuit UC_B of the user B in two partial reconfiguration blocks. Next, at a time T12, the processor configures a second logic circuit UC_B2 of the user B in two partial reconfiguration blocks, and operates the two logic circuits UC_B, UC_B2 in parallel. Similarly, at a time T13, the processor configures a second logic circuit UC_A2 of the user A in six partial reconfiguration blocks, and operates the two logic circuits UC_A, UC_A2 in parallel. As a result, the operation speeds of the logic circuits in the FPGA can be increased.

When, for example, the logic circuit of the user is an adder and a single adder completes an operation in N cycles, the operation is completed in N/2 cycles by configuring two adders and having the two adders execute the addition operation in parallel. This is an example of shortening a job execution time by increasing the parallelism of a logic circuit.

[Bus Bandwidth Bottleneck]

Figure 6:
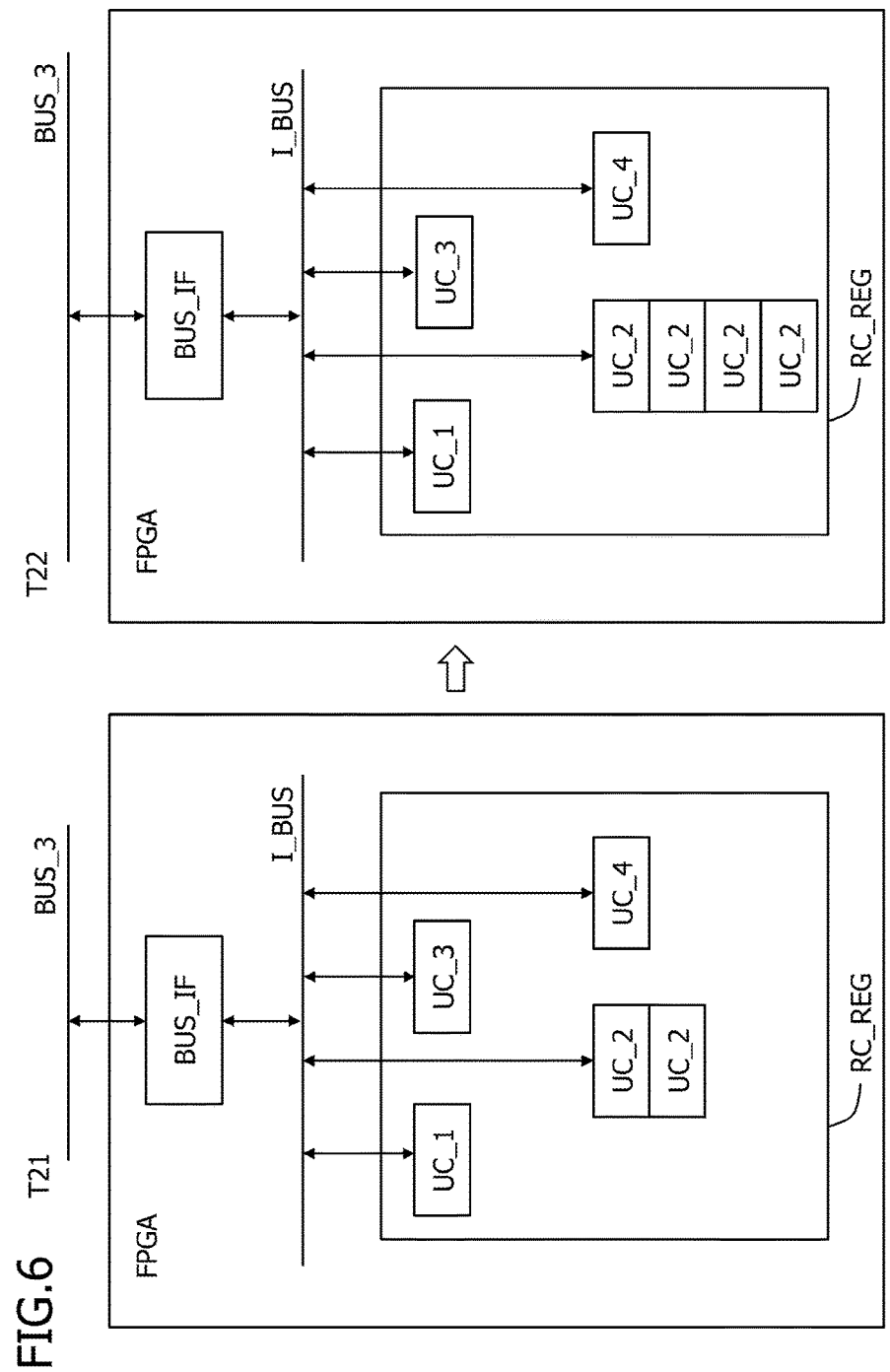
FIG. 6 is a view illustrating a bottleneck in a bandwidth of the FPGA bus.

FIG. 6 is a view illustrating a bottleneck in a bandwidth of the FPGA bus. The logic circuits configured in the FPGA access the FPGA memory 16, depicted in FIGS. 1 and 2, via the FPGA bus BUS_3. The FPGA memory 16 stores the configuration data of the reconfigured logic circuits, and data accessed by the configured logic circuits. Therefore, when the processor that executes the FPGA management program issues a request to the FPGA to configure a certain logic circuit, the control circuit in the FPGA accesses the FPGA memory and downloads the configuration data of the logic circuit. Further, when the logic circuits configured in the FPGA respectively execute jobs, the logic circuits access the data stored in the FPGA memory. Hence, the logic circuits configured in the FPGA respectively use bandwidths corresponding to data transfer rates thereof within a bandwidth that can be provided by the FPGA bus BUS_3.

In the example of FIG. 6, at a time T21, user circuits UC_1, UC_3, UC_4 of users 1, 3, 4 are configured in the reconfiguration region RC_REG of the FPGA at parallelism 1, and the user circuit UC_2 of the user 2 is configured at parallelism 2. It is assumed that the bandwidth that can be provided by the FPGA bus BUS_3 (i.e. an upper limit of a data transfer rate thereof) is 1350 MB/s, for example, and that average data transfer rates of the user circuits UC_1, UC_2, UC_3, UC_4 of the users 1, 2, 3, 4 are respectively 100 MB/s, 200 MB/s, 200 MB/s, and 300 MB/s. In the condition depicted in FIG. 6, a total value of the average data transfer rates of the configured user circuits UC_1 to UC_4 is 100+200×2+200+300=1000 MB/s. Hence, the total value 1000 MB/s does not reach the upper limit 1350 MB/s. In this condition, a bottleneck does not occur in the FPGA bus BUS_3, and the respective user circuits operate at predicted data transfer rates. As a result, job execution times correspond to predicted execution times.

At a time T22, however, the processor that executes the FPGA management program issues a request to the control circuit of the FPGA to increase the parallelism of the logic circuit UC_2 of the user 2 to 4, and as a result, the parallelism of the logic circuit UC_2 is increased to 4. It is assumed in this case that since the partial reconfiguration blocks needed to increase the parallelism of the logic circuit UC_2 to 4 are available within the reconfiguration region and the data transfer rate of the logic circuit UC_2 is predicted to be low, the processor predicts that the data transfer rate will not exceed the upper limit value of the bus bandwidth even after the parallelism is increased to 4.

In actuality, however, the total value of the data transfer rates of the operative logic circuits reaches 100+200×4+200+300=1400 MB/s, thereby exceeding the upper limit 1350 MB/s of the FPGA bus, and as a result, a bottleneck may occur in the bandwidth of the FPGA bus. Accordingly, the logic circuit UC_2 of the user 2, which has been increased to parallelism 4, is not able to use the bandwidth needed to execute the job, and as a result, the time taken by the logic circuit UC_2 of the user 2 to execute a single job becomes longer than the predicted execution time.

As described above, even when partial reconfiguration blocks are available in the reconfiguration region RC_REG of the FPGA such that the parallelism of a logic circuit is increased, however, the bandwidth of the FPGA bus may be insufficient, and therefore the total value of the data transfer rates of the logic circuits may reach the upper limit of the bus bandwidth, causing a bottleneck to occur in the bus bandwidth. As a result, the performance of the logic circuit having the increased parallelism does not improve, and therefore the partial reconfiguration blocks of the reconfiguration region are used wastefully.

First Embodiment

Figure 7:
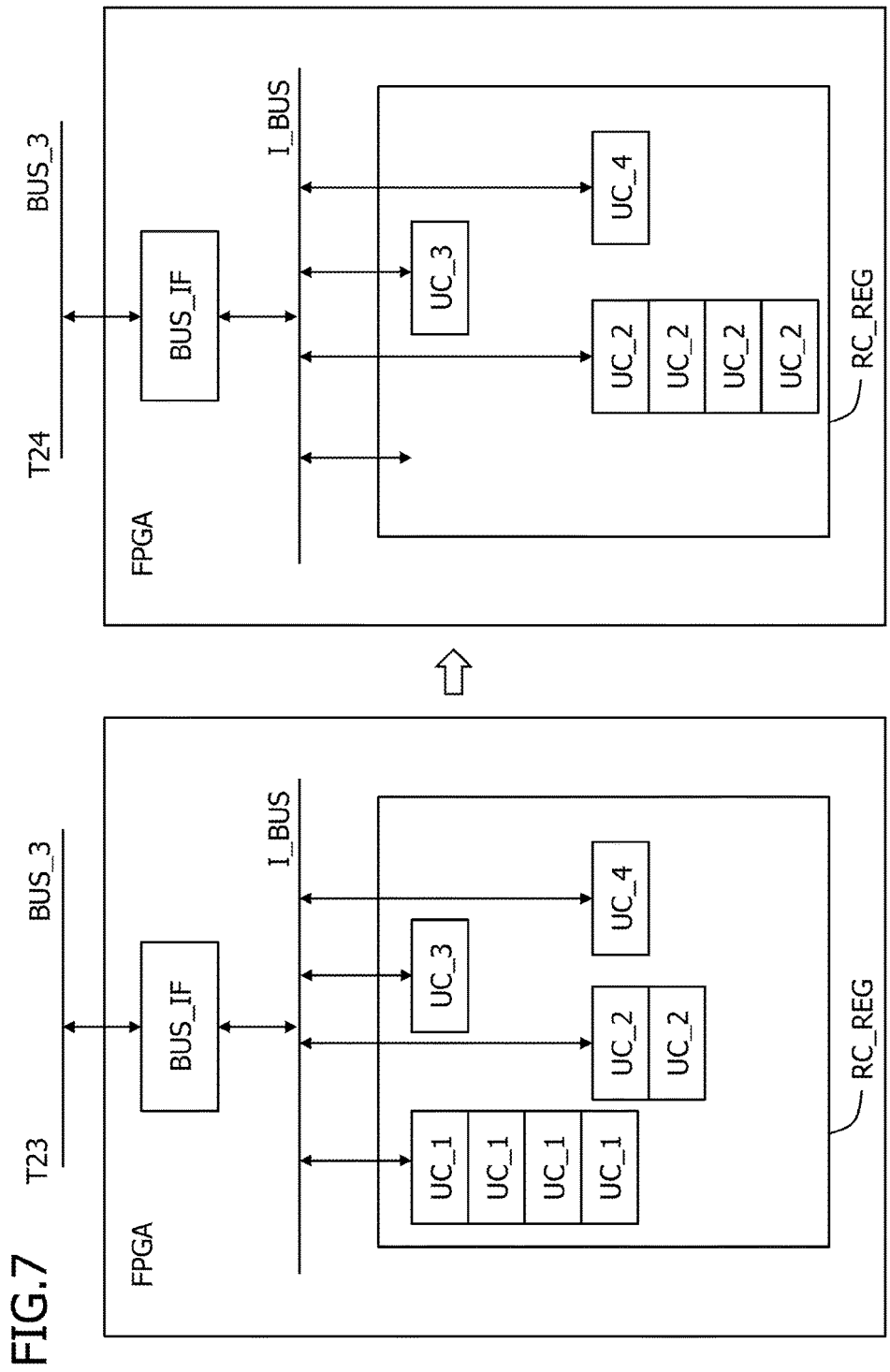
FIG. 7 is a view depicted an example of parallelism control implemented in an FPGA management method according to a first embodiment.

FIG. 7 is a view depicted an example of parallelism control implemented in an FPGA management method or program according to a first embodiment. In this FPGA management method, the logic circuit of a user includes an execution time measurement circuit that measures the execution time needed to execute a single job, and a data transfer rate measurement circuit that monitors access to the FPGA bus and measures an average value of the data transfer rate per unit time of bus access. These measurement circuits may be configured using the configuration data of the FPGA. The control circuit of the FPGA configures the measurement circuits using the configuration data thereof at the same time when configuring the logic circuit of the user using the configuration data thereof. Alternatively, the measurement circuits may be formed in advance in each of a plurality of partial reconfiguration blocks, and used as the measurement circuits of a logic circuit configured in the partial reconfiguration blocks.

The processor that executes the FPGA management program obtains measured values of the data transfer rates of a plurality of operative logic circuits configured in the reconfiguration region of the FPGA, and increases the respective parallelisms of the plurality of logic circuits configured in the reconfiguration region, within a range ensuring that the sum of the obtained measured values of the data transfer rates does not exceed the upper limit of the data transfer rate of the FPGA bus.

Further, in the first embodiment, when the sum of the obtained measured values of the data transfer rates reaches the upper limit of the data transfer rate of the FPGA bus, the processor reduces the parallelism of a logic circuit that satisfies a predetermined condition, among the plurality of logic circuits. The processor then increases the parallelism of a logic circuit other than the logic circuit having the reduced parallelism within a range not exceeding the upper limit of the data transfer rate of the FPGA bus. As a result, the operation of the logic circuit having the increased parallelism can be expected to reach completion in a shorter time than predicted. Once the operation of the logic circuit having the increased parallelism is complete, the processor increases the parallelism of the logic circuit having the reduced parallelism within a range not exceeding the upper limit. As a result, the operation of this logic circuit can be expected to reach completion in a shorter time than predicted.

In terms of the example depicted in FIG. 7, the processor obtains measured values of the data transfer rates of the operative logic circuits in the condition at the time T22 in FIG. 6, and detects that the total bandwidth thereof has reached the upper limit of the data transfer rate of the FPGA bus. Therefore, at a time T23 in FIG. 7, the processor reduces the parallelism of the logic circuit UC_2 of the user 2, which is believed to be the cause of the bus bottleneck, to 2. The processor then increases the parallelism of the logic circuit UC_1 of the user 1, in which the data transfer rate of the logic circuit is low, from 1 to 4. Accordingly, the sum of the measured values of the data transfer rates of the operative logic circuits reaches 100×4+200×2+200+300=1300 MB/s, which is lower than the upper limit 1350 MB/s of the FPGA bus, and as a result, the bottleneck in the bus bandwidth is eliminated.

Hence, the operation time of the logic circuit UC_1 of the user 1 is predicted to shorten such that the operation thereof is completed in a shorter time. When the operation of the logic circuit UC_1 of the user 1 is completed at a time T24, the processor increases the logic circuit UC_2 of the user 2 having the reduced parallelism preferentially from parallelism 2 to 4. The processor then obtains the measured values of the data transfer rates of the operative logic circuits, and detects that the sum of the measured values, i.e. 200×4+ 200+300=1300 MB/s, is lower than the upper limit 1350 MB/s of the FPGA bus. Likewise in this condition, the bottleneck in the bus bandwidth can be eliminated, and as a result, the logic circuits can perform operations sufficiently.

Figure 8:
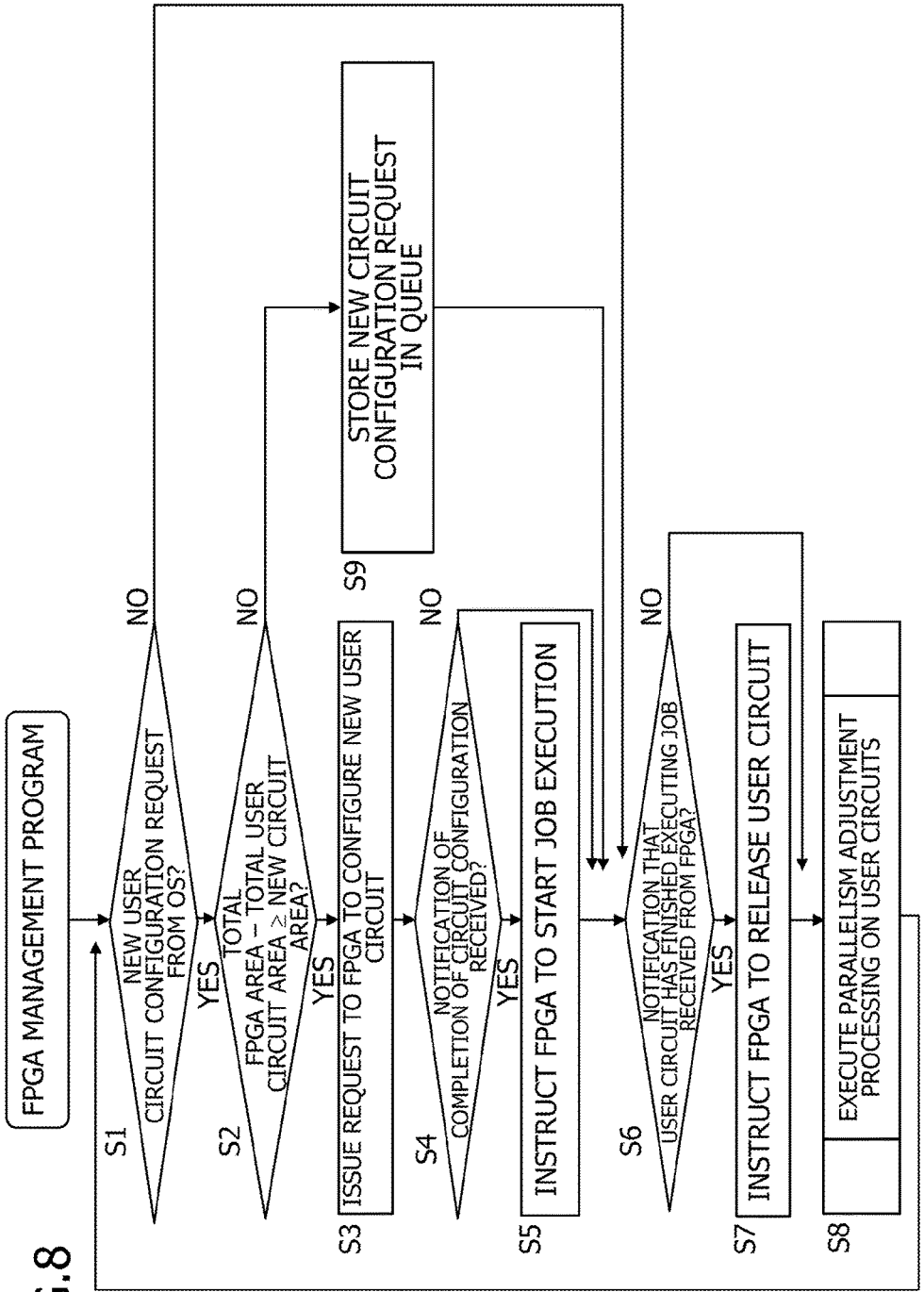
FIG. 8 is a flowchart of the FPGA management program according to the first embodiment.

FIG. 8 is a flowchart of the FPGA management program according to the first embodiment. For example, a job management program of the operating system (OS) monitors the jobs of the user application programs executed by the processor, and when a process of a job can be executed by a logic circuit in the FPGA, issues an interrupt of issuing a request for configuring a new user circuit to the processor.

Having received the request for configuring a new user circuit from the operating system (OS) (YES in S1), the processor that executes the FPGA management program processes the request as follows. First, the processor determines whether or not a value obtained by subtracting a total area of the operating user circuits from a total area of the reconfiguration region of the FPGA is larger than an area of the new user circuit (S2). The total area of the reconfiguration region of the FPGA corresponds to the number of partial reconfiguration blocks PB, for example, and the total area of the operating user circuits corresponds to the number of partial reconfiguration blocks in which the operating user circuits are configured, for example.

When the determination of step S2 is affirmative (YES), the processor issues a request to the FPGA to configure the new user circuit (S3). Then, having received notification from the FPGA that configuration of the new user circuit is complete (YES in S4), the processor instructs the FPGA to start the job using the user circuit (S5). When the determination of step S2 is negative (NO), on the other hand, the processor does not issue a request to the FPGA to configure the new user circuit, and instead, stores a new circuit configuration request in a request queue (a request waiting line) (S9). The request in the request queue is checked in step S1 of the next cycle as a new user circuit configuration request.

Further, after receiving notification from the FPGA that the user circuit has finished executing the job (S6), the processor instructs the FPGA to release the user circuit that has finished executing the job (S7). Accordingly, the control circuit in the FPGA releases the user circuit configured in the reconfiguration region. When the user circuit is released, a new configuration data for a new user circuit can be written in the corresponding storage area in the configuration RAM C_RAM. And the released user circuit can be activated later without restoring the configuration data in the configuration RAM.

Furthermore, the processor executes parallelism adjustment processing S8 on the user circuits. The parallelism adjustment processing executed on the user circuits will be described below. Further, the processor executes steps S1 to S8, described above, repeatedly.

First, before describing the parallelism adjustment processing, examples of various parameters of the user circuits managed by the processor will be described.

FIG. 9 is a table illustrating parameters of the user circuits managed by the processor. The table in FIG. 9 illustrates values of a parallelism PL, a predicted configuration time CT_E, a predicted execution time ET_E, a predicted use bandwidth BD_E, a measured execution time ET_M, and a measured use bandwidth BD_M of each logic circuit in relation to each of the user circuits UC_1, UC_2, UC_3, and UC_4 configured in the reconfiguration region of the FPGA.

The predicted configuration time CT_E is a predicted or estimated value of a time needed to download the configuration data of the logic circuit from the FPGA memory and set the downloaded data in the configuration data memory C_RAM of the FPGA. The predicted execution time ET_E is a predicted or estimated value of the time needed for the logic circuit to finish executing a single job. The predicted use bandwidth BD_E is a predicted or estimated value of the bus bandwidth (the data transfer rate) used by the logic circuit per unit time while executing the job, the unit of the predicted use bandwidth BD_E being MB/s.

The measured execution time ET_M and the measured use bandwidth BD_M, meanwhile, are measured values obtained respectively by the execution time measurement circuit and the data transfer rate measurement circuit provided in the logic circuit.

Further, the upper limit of the FPGA bus bandwidth is set at BD_L. The upper limit of bandwidth BD_L denotes a bandwidth of the FPGA bus, and it is impossible for the sum of the data transfer rates at which the logic circuits configured in the reconfiguration region transfer data to the FPGA bus to exceed the upper limit of bandwidth BD_L. Therefore, when the sum of the data transfer rates of the logic circuits configured in the reconfiguration region reaches the upper limit of bandwidth BD_L, it may be assumed that a bottleneck has occurred in the bandwidth.

In the parallelism adjustment processing S8 executed on the logic circuits of the users, the processor controls the respective parallelisms of the logic circuits of the users in the reconfiguration region of the FPGA on the basis of the values depicted in FIG. 9.

Figure 10:
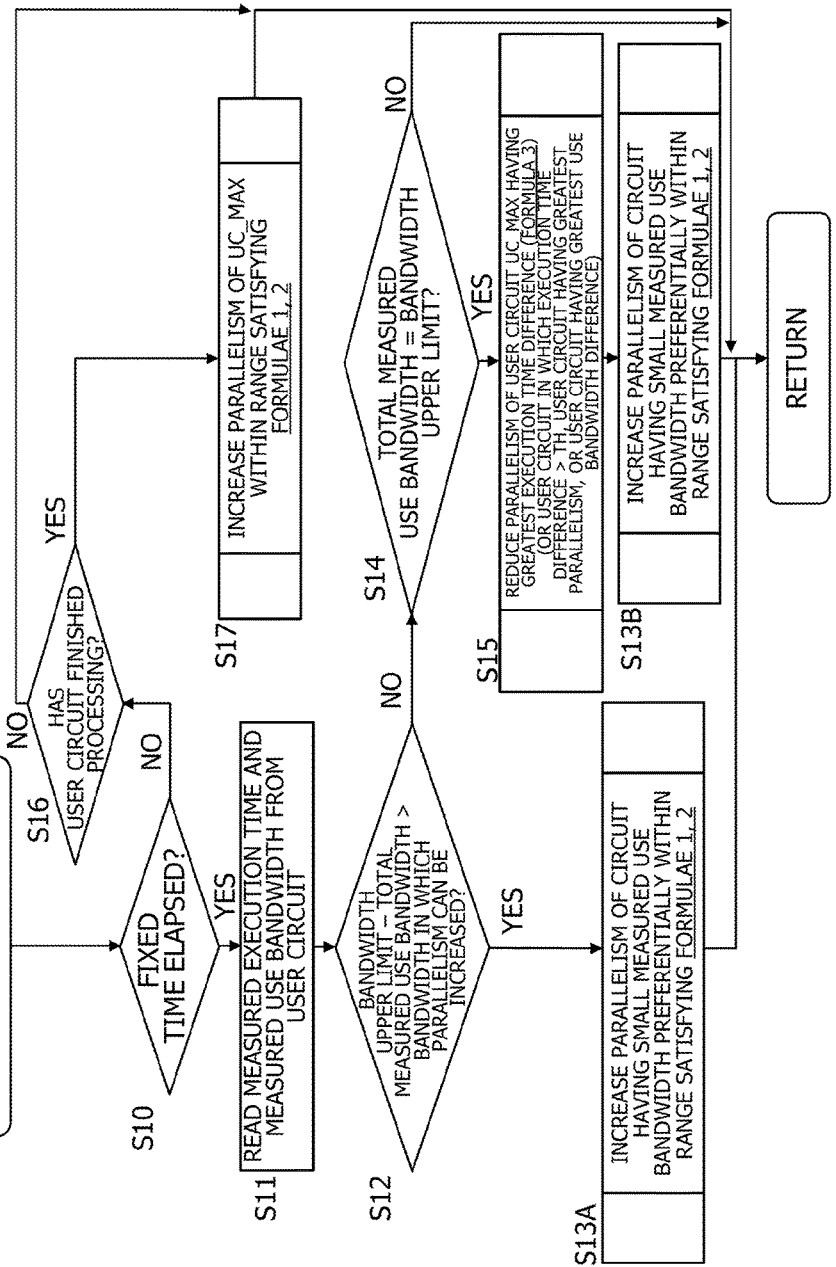
FIG. 10 is a flowchart of the parallelism adjustment processing executed on the user circuits.

FIG. 10 is a flowchart of the parallelism adjustment processing executed on the user circuits. Every time a fixed time elapses (YES in S10), the processor that executes the FPGA management program either reads the measured execution time ET_M and the measured use bandwidth BD_M measured by the execution time measurement circuit and the use bandwidth measurement circuit of each of the user circuits configured in the FPGA from the two circuits, or receives the measured execution time ET_M and the measured use bandwidth BD_M from the control circuit 151 of the FPGA (S11).

[Parallelism Increase Control (1)]

The processor then determines whether or not a value obtained by subtracting the total value of the measured use bandwidths of the user circuits from the upper limit of bandwidth BD_L of the FPGA bus is larger than a minimum bandwidth needed to increase the parallelism of one of the user circuits currently configured in the FPGA (S12). When the determination of step S12 is affirmative (YES), the processor increases the parallelism of a circuit having a small measured use bandwidth preferentially within a range satisfying Formula 1 and Formula 2, illustrated below (S13A).

Figure 11:
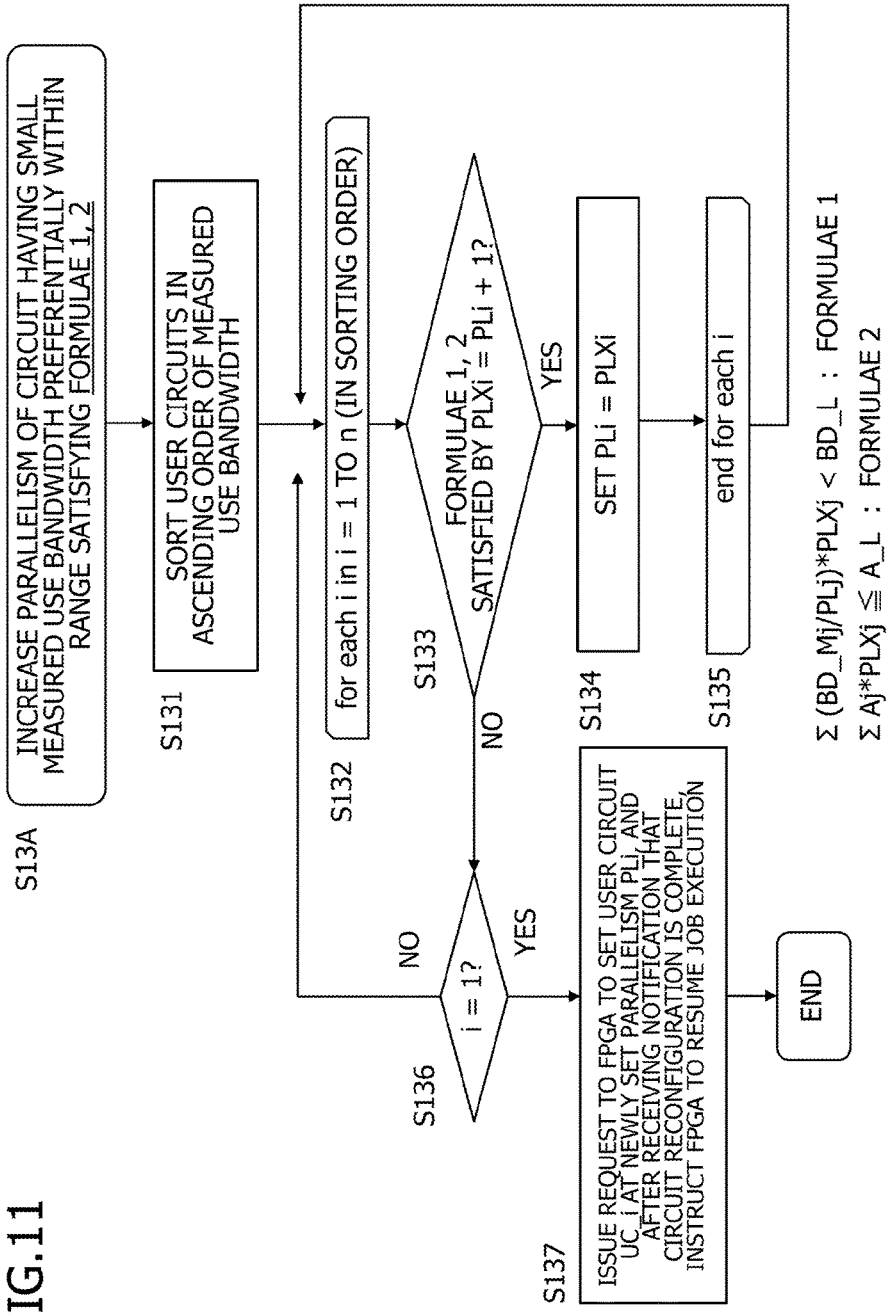
FIG. 11 is a flowchart illustrating the parallelism increase processing of step S13A.

FIG. 11 is a flowchart illustrating the parallelism increase processing of step S13A. First, the processor sorts the plurality of (n) user circuits in ascending order of the measured use bandwidth BD_M (S131). A coefficient i=1 to n is allocated to the order of each sorted user circuit. The processor then implements a determination on each i of the coefficients i=1 to n (S132 to S135) in the sorting order (in ascending order of the measured use bandwidth), or in other words in coefficient order, to determine whether or not Formula 1 and Formula 2, illustrated below, are satisfied by a parallelism PLXi (=PLi+1) obtained by increasing the parallelism PLi of the i-th user circuit, which is a processing target, by 1 (S133).

Formula 1 and Formula 2 are as illustrated in FIG. 11 and below.

$$\Sigma(BD\_Mj/PLj)*PLXj < BD\_L \quad \text{Formula 1}$$

$$\Sigma(Aj*PLXj) \leq A\_L \quad \text{Formula 2}$$

Here, $\Sigma$ is the sum of all user circuits j=1 to n. Further, PLXj in Formula 1 and Formula 2 is set as PLXj=PLj+1 when j=i and PLXj=PLj when j≠i so that the parallelism PLj of only the i-th user circuit, which is a processing target, is increased by 1 and the parallelisms PLj of the user circuits other than the i-th user circuit is not increased.

In other words, when n=4 and i=2, Formula 1 is as follows.

$$(BD\_M1/PL1)*PL1+(BD\_M2/PL2)*PLX2+(BD\_M3/PL3)*PL3+(BD\_M4/PL4)*PL4 < BD\_L$$

The first term on the left side is (BD_M1/PL1)*PL1=BD_M1, and the third and fourth terms are similar. Hence, Formula 1 is as follows.

$$BD\_M1+(BD\_M2/PL2) \times PLX2+BD\_M3+BD\_M4 < BD\_L$$

Further, Aj in Formula 2 denotes the circuit area (the number of partial reconfiguration blocks, for example) of a user circuit having parallelism 1, and A_L denotes the total circuit area (the total number of partial reconfiguration blocks, for example) of the reconfiguration region. When n=4 and i=2, Formula 2 is as follows.

$$A1*PL1+A2*PLX2+A2*PL3+A4*PL4 \leq A\_L$$

When Formula 1 is satisfied, this means that the total use bandwidth of all of the user circuits after increasing the parallelism PLi of only the i-th user circuit, which is the processing target, by 1 is smaller than the upper limit of bandwidth BD_L of the FPGA bus. In Formula 1, (BD_M2/PL2)*PLX2 means that the measured use bandwidth is proportionate to the parallelism. When Formula 2 is satisfied, meanwhile, this means that the total use area of all of the user circuits after increasing the parallelism PLi of only the i-th user circuit, which is the processing target, by 1 is equal to or smaller than the total circuit area A_L of the FPGA.

When the determination of step S133 is affirmative (YES in S133), the processor sets the increased parallelism PLXi as the parallelism PLi of the corresponding user circuit UC_i (S134). When step S133 is affirmative in relation to all of the coefficients i=1 to n, this means that the parallelisms PLi of all of the user circuits have been set at +1.

When, on the other hand, the determination of step S133 is negative in relation to one of the coefficients i=1 to n (NO in S133) and the coefficient i does not indicate i=1 (NO in S136), steps S133 and S134 are repeated on each i of the coefficients i=1 to n (S132 to S135). When the determination of step S133 is negative and the coefficient i indicates i=1 (YES in S136), the loop of S132 to S135 is exited. In other words, the parallelism is increased by 1 in order from the user circuit having the smallest measured use bandwidth to the user circuit having the largest measured use bandwidth, and when a negative determination is obtained in step S133 in relation to a certain user circuit, a determination as to whether or not it is possible to increase the parallelism by 1 is made again in order from the user circuit having the smallest measured use bandwidth to the user circuit having the largest measured use bandwidth. Then, when the coefficient i indicates i=1 and the determination of step S133 is negative (i.e. when it is not possible to increase the parallelism by 1), the processing of the loop S132 to S135 is terminated.

The CPU then issues a request to the FPGA to reconfigure the user circuit UC_i to the newly set parallelism PLi, and after receiving notification that reconfiguration of the user circuit is complete, instructs the FPGA to resume execution of the job using the user circuit (S137).

The reason for increasing the parallelism of a circuit having a small measured use bandwidth preferentially, as in FIG. 11, is as follows. Typically, when the measured use bandwidth is small, the use bandwidth at parallelism 1 may tend to be correspondingly low as well. And therefore, it is likely possible to increase the parallelism of such small bandwidth user circuit. And when increasing the parallelism of the small bandwidth user circuit, the job execution time thereof can be shortened such that the job thereof can be finished earlier. Once the user circuit having increased the parallelism finishes executing the job, it may be possible to increase the parallelism of the other user circuits in order to shorten the job execution times thereof.

[Reducing the Parallelism of a User Circuit Estimated to be the Cause of a Bottleneck in the Bus Bandwidth, and Increasing the Parallelism of the Other User Circuits]

Returning to FIG. 10, when the determination of step S12 is negative, the processor determines whether or not the total measured use bandwidth has reached the upper limit of bandwidth of the FPGA bus (S14). When the determination of step S14 is affirmative, this means that a bottleneck has occurred in the bandwidth of the FPGA bus. The upper limit of bandwidth (the data transfer rate) of the FPGA bus can be measured by executing a test application program that includes jobs being processed by a logic circuit in the FPGA. However, the upper limit of data transfer rate of FPGA bus is varied depending on which application program being executed. And the upper limit of data transfer rate of FPGA bus is also varied while executing an application program. Therefore, in the determination S14, whether or not the total measured use bandwidth has reached the upper limit of bandwidth of the FPGA bus, the processor may determine whether the total measured use bandwidth has reached a reference level that is calculated by subtracting a certain margin or an error from the measured upper limit of bandwidth.

Hence, the processor reduces the parallelism of a user circuit UC_MAX having the greatest difference between the predicted execution time and the measured execution time in accordance with Formula 3, illustrated below (S15). The user circuit having the greatest difference between the predicted execution time ET_E and the measured execution time ET_M is likely to be unable to use the bandwidth of the FPGA bus up to the predicted use bandwidth BD_E due to the bottleneck. Therefore, by reducing the parallelism of this user circuit, a situation in which some of the user circuits do not operate sufficiently due to the bottleneck and are therefore configured wastefully in the FPGA can be resolved.

Instead of selecting the user circuit having the greatest difference as the target user circuit for parallelism reduction, as described above, a user circuit in which the difference is greater than a threshold TH such as an average value of the differences of all of the user circuits may be selected. In this case, a plurality of user circuits may be selected. Alternatively, the user circuit having the greatest difference between the predicted use bandwidth BD_E and the measured use bandwidth BD_M may be selected. In this case, the user circuit having the greatest difference is a user circuit that is unable to use the bandwidth of the FPGA bus up to the predicted use bandwidth BD_E due to the bottleneck, and therefore this user circuit is selected as the target for parallelism reduction. Moreover, the user circuit having the largest parallelism may be selected, and the parallelism thereof may be reduced. In this case, it may be assumed that the user circuit controlled to the largest parallelism is more highly favored than the other user circuits, and therefore this user circuit is selected as the target for parallelism reduction.

Figure 12:
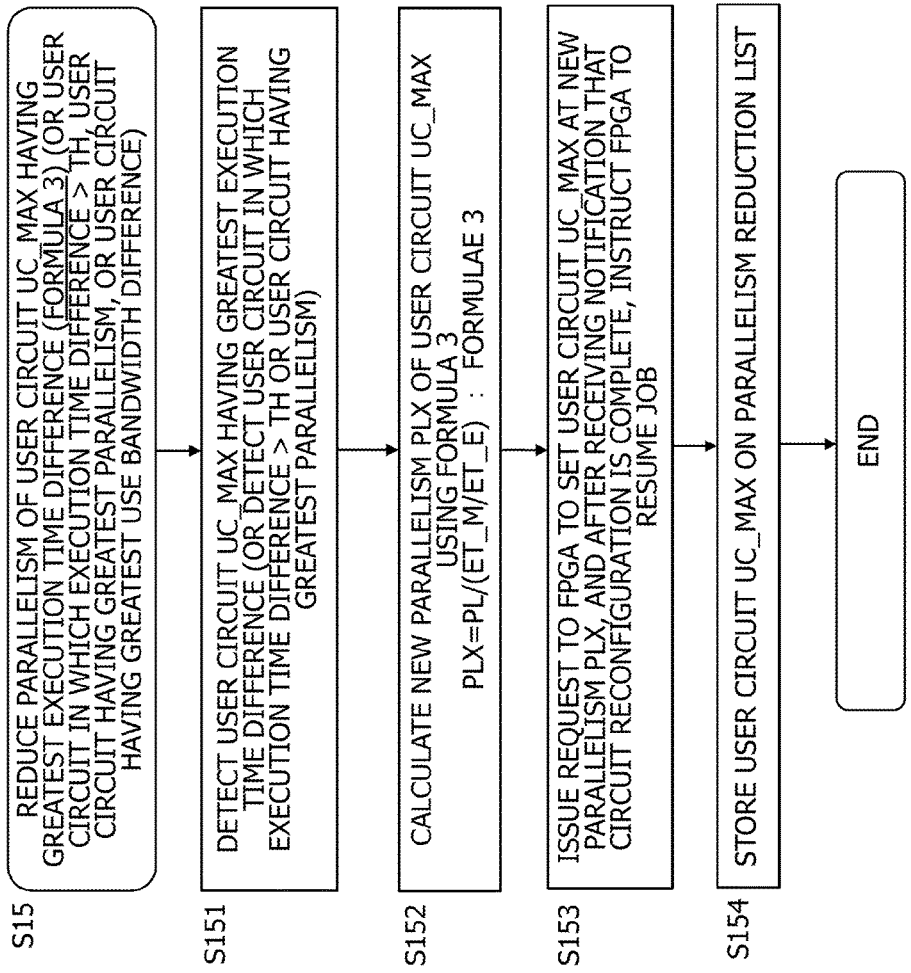
FIG. 12 is a flowchart illustrating the processing of step S15.

FIG. 12 is a flowchart illustrating the processing of step S15. When the total measured use bandwidth of all of the user circuits reaches the upper limit of bandwidth of the FPGA bus (YES in S14 of FIG. 10), the processor detects the user circuit UC_MAX having the greatest difference between the predicted execution time ET_E and the measured execution time ET_M (S151). As noted above, in another method, the user circuit in which the difference is greater than a threshold TH such as the average value of the differences of all of the user circuits, the user circuit having the greatest difference between the predicted use bandwidth and the measured use bandwidth, or the user circuit having the largest parallelism may be selected.

The processor then calculates the new parallelism PLX of the selected user circuit UC_MAX in accordance with Formula 3, illustrated below (S152).

$$PLX = PL/(ET\_M/ET\_E) \qquad \text{Formula 3}$$

The basis of the above formula is that since the parallelism of the user circuit is proportionate to a processing amount of the user circuit and the processing amount is proportionate to the inverse of the execution time, the parallelism and the execution time are in inverse proportion.

More specifically, in a prediction performed in advance, the execution time needed to execute a single job for the parallelism PL is set as the predicted execution time ET_E, but when a bottleneck occurs in the bus bandwidth, the usable bus bandwidth is limited, and accordingly, the measured execution time ET_M becomes longer than the predicted execution time ET_E. It is therefore assumed that by setting a parallelism corresponding to the measured execution time ET_M as the new parallelism PLX, the bottleneck in the bus bandwidth can be eliminated. If the bottleneck is not eliminated, the parallelism of the user circuit is reduced again on the basis of the measured value obtained in the next cycle such that eventually, the bottleneck is eliminated.

As described above, the parallelism and the execution time are in inverse proportion, and therefore the following formula is established.

$$PL:PLX = 1/ET\_E : 1/ET\_M$$

By solving this formula, Formula 3 is obtained.

Next, the processor issues a request to the FPGA to configure the user circuit UC_MAX, which is the target of parallelism reduction, with the new parallelism PLX, and after receiving notification that circuit reconfiguration is complete, instructs the FPGA to resume execution of the job using the user circuit (S153). The processor then stores the user circuit UC_MAX having the reduced parallelism on a parallelism reduction list (S154). The parallelism reduction list is referred to during parallelism increase control executed when the processing of the other user circuits is complete, as will be described below.

Returning to FIG. 10, after reducing the parallelism of the user circuit UC_MAX believed to be the cause of the bottleneck in the bus bandwidth (S15), the processor implements control to increase the parallelism of a circuit having a small measured use bandwidth, among the user circuits other than the user circuit UC_MAX, preferentially within a range satisfying Formula 1 and Formula 2 (S13B). The control step S13B for increasing the parallelism is similar to the control step S13A described above.

Figure 13:
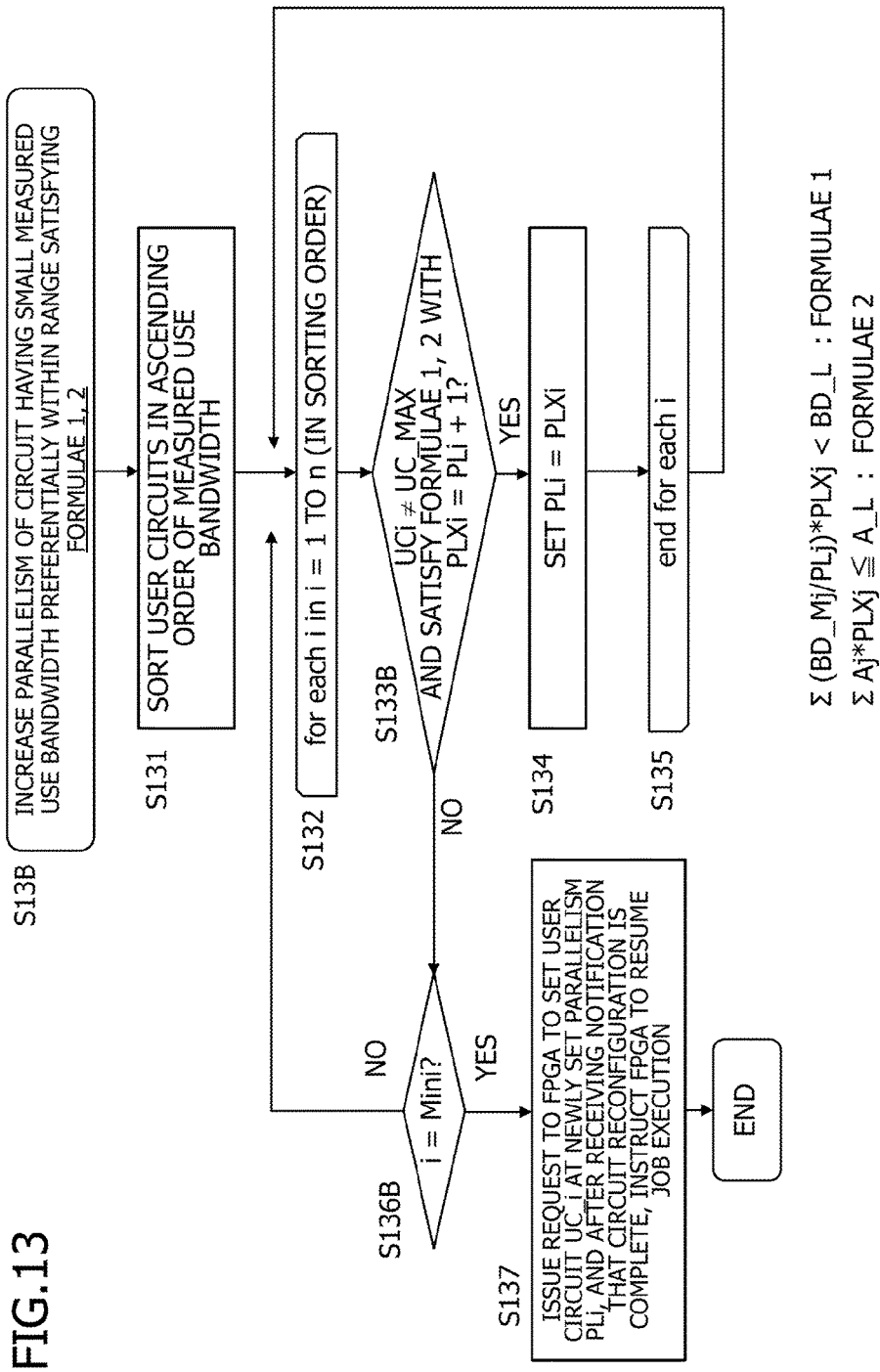
FIG. 13 is a flowchart illustrating the processing of step S13B.

FIG. 13 is a flowchart illustrating the processing of step S13B. Step S13B differs from step S13A of FIG. 11 in the content of step S133B and step S136B. More specifically, in step S133B, a determination is made as to whether or not any of the user circuits other than the user circuit UC_MAX subjected to parallelism reduction in step S15 of FIG. 10 satisfy Formula 1 and Formula 2. Further, in step S136B, when the sorting order i indicates the lowest sorting order among the remaining user circuits other than the user circuit UC_MAX (YES in S136B), the loop S132 to S135 is exited.

Otherwise, FIG. 13 is identical to FIG. 11. As a result, the parallelism of a user circuit having a small measured use bandwidth, among the remaining user circuits other than the user circuit UC_MAX having the reduced parallelism, can be increased preferentially.

[Control for Increasing Parallelism of User Circuit UC_MAX]

Returning to FIG. 10, when the processor, while waiting for the fixed time to elapse (NO in S10), receives a notification that a user circuit has finished executing a job (YES in S16), the processor executes control to increase the parallelism of the user circuit UC_MAX within a range satisfying Formula 1 and Formula 2 (S17). When the processor does not receive the notification that a user circuit has finished executing a job while waiting for the fixed time to elapse, the processor terminates the parallelism adjustment processing S8 executed on the user circuits.

Figure 14:
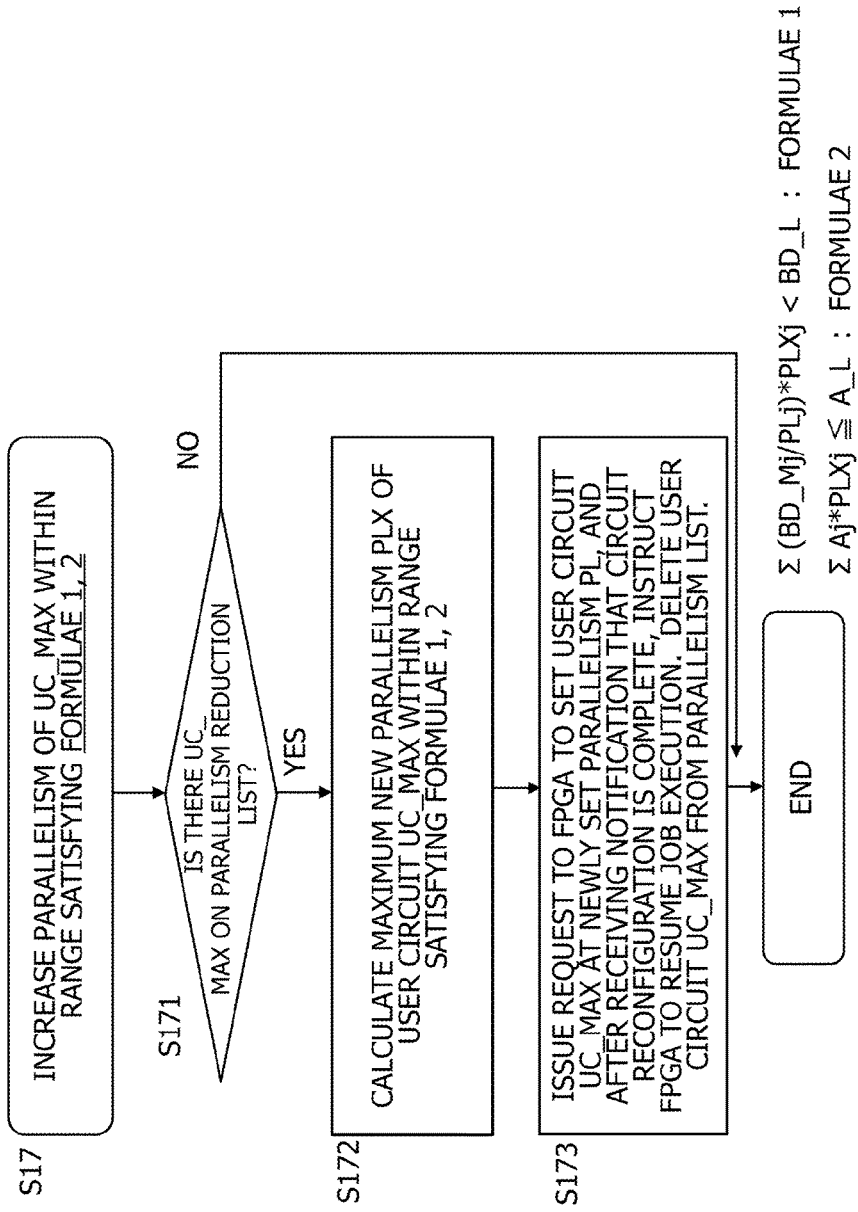
FIG. 14 is a flowchart illustrating the processing of step S17.

FIG. 14 is a flowchart illustrating the processing of step S17. After receiving the notification that a user circuit has finished executing a job (YES in S16 of FIG. 10), the processor determines whether there is the user circuit UC_MAX on the parallelism reduction list or not (S171). When the user circuit UC_MAX is on the list (YES in S171), the processor calculates the maximum new parallelism PLX of the user circuit UC_MAX within a range satisfying Formula 1 and Formula 2 (S172). Formula 1 and Formula 2 are identical to Formula 1 and Formula 2 in FIGS. 11 and 13. Note, however, that here, an immediately preceding user circuit has finished job execution and has been released, and therefore the released user circuit is excluded from Formula 1 and Formula 2. Further, the parallelism increase target is the user circuit UC_MAX.

For example, when the circuit UC_2 of the user 2 is stored on the parallelism reduction list and the circuits UC_1, UC_3 of the user 1 and the user 3 have completed job execution, Formula 1 and Formula 2 are as follows.

$$(BD\_M2/PL2)*PLX2+BD\_M4<BD\_L \quad \text{Formula 1}$$

$$A2*PLX2+A4*PL4 \leq A\_L \quad \text{Formula 2}$$

The processor calculates the maximum new parallelism PLX2 within a range satisfying the above formulae. As a result, the user circuit UC_MAX (UC_2) is controlled for increasing the parallelism thereof preferentially when the other user circuits have completed execution.

The processor then issues a request to the FPGA to configure a logic circuit at the new parallelism PLX of the user circuit UC_MAX, and after receiving notification that circuit reconfiguration is complete, instructs the FPGA to resume execution of the job (S173). Furthermore, the processor deletes the user circuit UC_MAX having the increased parallelism from the parallelism reduction list (S173).

Returning to FIG. 10, the parallelism adjustment control executed by the processor on the user circuits can be summarized as follows. Under normal conditions, the processor obtains the measured execution time ET_M and the measured use bandwidth BD_M from the measurement circuits of each user circuit in the FPGA at fixed time intervals (S11). When the total measured use bandwidth of all of the user circuits is lower than the upper limit of the FPGA bus bandwidth by a bandwidth needed to increase the parallelism (YES in S12), the processor increases the parallelism of a user circuit having a small measured use bandwidth preferentially within a range satisfying Formula 1 and Formula 2 (S13A). Further, when a certain user circuit completes job execution (YES in S16) and there is no user circuit UC_MAX having the reduced parallelism (NO in S171), the determination of step S12 becomes affirmative on the basis of the measured use bandwidth BD_M obtained in the next measurement cycle, and therefore the processor again increases the parallelism of the user circuit having the small measured use bandwidth preferentially within a range satisfying Formula 1 and Formula 2 (S13A).

When the total value of the measured use bandwidth reaches the upper limit of the FPGA bus bandwidth (YES in S14), on the other hand, the processor selects the user circuit UC_MAX believed to be the cause of the bottleneck in the FPGA bus bandwidth, and reduces the parallelism thereof on the basis of Formula 3 (S15). The processor then increases the parallelism of a user circuit having a small measured use bandwidth, among the remaining user circuits, preferentially within a range satisfying Formula 1 and Formula 2 (S13B).

Furthermore, when a certain user circuit completes job execution (YES in S16), the processor increases the parallelism of the user circuit UC_MAX having the reduced parallelism to the maximum parallelism within a range satisfying Formula 1 and Formula 2 (S17). In so doing, the processor temporarily reduces the parallelism of the user circuit UC_MAX believed to be the cause of the bottleneck in the bus bandwidth, but increases the parallelisms of the other user circuits, thereby advancing the execution completion times thereof. Further, when the other user circuits complete job execution, the parallelism of the user circuit UC_MAX having the temporarily reduced parallelism is increased again. If the parallelism can be increased to a higher value than the parallelism prior to the reduction, it may also be possible to advance to job execution completion time of the user circuit UC_MAX.

[Specific Example of Parallelism Adjustment]

FIG. 15 is a table illustrating a specific example of a case in which the user circuit parallelism adjustment according to the first embodiment is applied. In this specific example, the logic circuit UC_1 of the user 1 and the logic circuit UC_2 of the user 2 are configured and operating within the FPGA. The table in FIG. 15 illustrates respective values of the parallelism PL, the predicted or estimated configuration time CT_E, the predicted execution time ET_E, the predicted use bandwidth BD_E, the measured execution time ET_M, the measured use bandwidth BD_M, and a proportion RT of the FPGA occupied by the user circuit between a time t0 and a time t7 in relation to each of the user circuits UC_1 and UC_2. Further, the upper limit BD_L of the FPGA bus bandwidth is set at 1400 MB/S.

Figure 16:
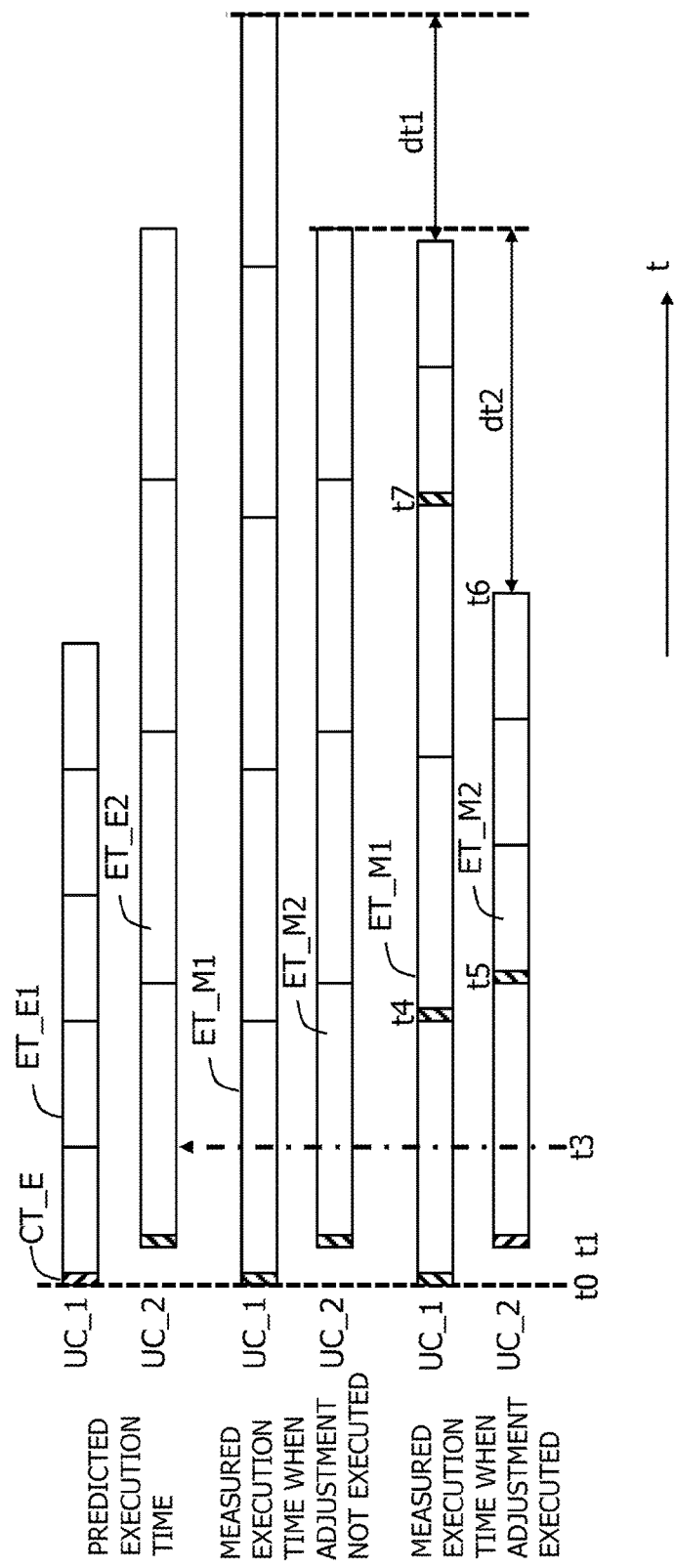
FIG. 16 is a view illustrating the predicted execution times, the measured execution times when parallelism adjustment is not executed, and the measured execution times when parallelism adjustment is executed in the specific example of FIG. 15.

FIG. 16 is a view illustrating the predicted execution times, the measured execution times when parallelism adjustment is not executed, and the measured execution times when parallelism adjustment is executed in the specific example of FIG. 15. FIG. 16 illustrates the predicted execution times, the measured execution times when parallelism adjustment is not executed, and the measured execution times when parallelism adjustment is executed in a case where the user circuits UC_1 and UC_2 execute jobs four consecutive times. In the diagram, shaded time periods denote the predicted configuration time CT_E, and unshaded time periods denote the predicted execution time ET_E and the measured execution time ET_M.

A specific example of the parallelism adjustment processing will now be described with reference to FIGS. 15 and 16. It is assumed as a prerequisite that the user circuit UC_1 is configured in the FPGA and starts the operation at a time t0, and the user circuit UC_2 is configured in the FPGA and starts the operation at a time t1. Note, however, that a bottleneck occurs in the FPGA bus bandwidth at approximately a time t3, with the result that a measured execution time ET_M1 (200 ms) of the user circuit UC_1 becomes much longer than a predicted execution time ET_E1 (100 ms).

As depicted in FIG. 15, the processor configures the user circuit UC_1 in the FPGA at parallelism PL=8 from the time t0 onward, but since the measured execution time ET_M1, which is 200 ms, is approximately twice as long as the predicted execution time ET_E1, which is 100 ms, a measured use bandwidth BD_M1 of 1200 MB/s is larger than a predicted use bandwidth BD_E1 of 1000 MB/s. Meanwhile, the processor configures the user circuit UC_2 in the FPGA at parallelism PL=2 from the time t1 onward, and since a measured execution time ET_M2 thereof, which is 200 ms, matches a predicted execution time ET_E2 thereof, which is also 200 ms, a measured use bandwidth BD_M2 thereof, which is 200 MB/s, matches a predicted use bandwidth BD_E2, which is also 200 MB/s. Hence, the total measured use bandwidth of the two user circuits is 1200+200=1400 MB/s, and therefore reaches the upper limit BD_L of the FPGA bus bandwidth.

In this condition, it is estimated that the reason why the measured execution time ET_M1 of the user circuit UC_1 is twice as long as the predicted execution time ET_E1 and the measured use bandwidth BD_M1 thereof is longer than the predicted use bandwidth BD_E1 is that the user circuit UC_1 is not operating as predicted due to a bottleneck in the FPGA bus bandwidth. In other words, it is assumed that the measured execution time ET_M1 of the user circuit UC_1 has deviated from the predicted use bandwidth BD_E, causing a bottleneck to occur in the FPGA bus bandwidth.

Therefore, at a time t4, the processor selects the user circuit UC_1 having the greatest difference between the predicted execution time and the measured execution time as the parallelism reduction target, and reduces the parallelism PL=8 to a new parallelism PLX=4 in proportion with an inverse ratio (2:1) of the predicted execution time ET_E1=100 ms to the measured execution time ET_M1=200 ms. The new parallelism is calculated on the basis of Formula 3, described above. Hence, from the time t4 onward, the measured execution time ET_M1 and the measured use bandwidth BD_M1 of the user circuit UC_1 shift to 200 ms and 600 MB/s, respectively, in accordance with the halved parallelism. As a result, the total measured use bandwidth of the two user circuits UC_1, UC_2 is 600+200=800 MB/s, which is lower than the upper limit 1400 MB/s.

Accordingly, at a time t5, the processor increases the parallelism of the user circuit UC_2 other than the user circuit UC_1 having the reduced parallelism within a range satisfying Formula 1 and Formula 2 such that the parallelism of the user circuit UC_2 is increased from 2 to 4. The maximum parallelism is limited to 4 to ensure that the total circuit area (32%+60%) of Formula 2 does not exceed the circuit surface area 100% of the FPGA. Accordingly, the measured execution time ET_M2 and the measured use bandwidth BD_M2 of the user circuit UC_2 are respectively halved to 100 ms and doubled to 400 MB/s. As a result, the user circuit UC_2 completes the processing at a time t6, which is earlier than the predicted execution time by a time dt2. In other words, in FIG. 15, the parallelism of the user circuit UC_2 is 0 at the time t6, and the execution time, use bandwidth, and area proportion thereof are also all 0.

Accordingly, at a time t7, the processor calculates the parallelism of the user circuit UC_1 having the reduced parallelism on the basis of Formula 3, and increases the parallelism from 4 to 9. The increase in the parallelism is determined on the basis of the limitation applied by Formula 1 for setting the use bandwidth below the upper limit. By increasing the parallelism by a multiple of 2.25, the predicted execution time ET_E1 and the measured execution time ET_M1 are both shortened to 88.9 ms, while the predicted use bandwidth BD_E1 and the measured use bandwidth BD_M1 are both increased to 1350 MB/s. As a result, as depicted in FIG. 16, the time taken by the user circuit UC_1 to finish executing a job is shortened by a time dt1 in comparison with a case where the parallelism is not adjusted.

Second Embodiment

In the first embodiment, when a bottleneck occurs in the FPGA bus bandwidth, the processor estimates that the parallelism of the user circuit having the greatest difference between the measured execution time and the predicted execution time is set wastefully high due to the bottleneck, and therefore reduces the parallelism of the user circuit to a new parallelism that is appropriate for the measured execution time.

In a second embodiment, however, the processor simply executes control to keep the parallelisms of all of the user circuits as uniform as possible.

Figure 17:
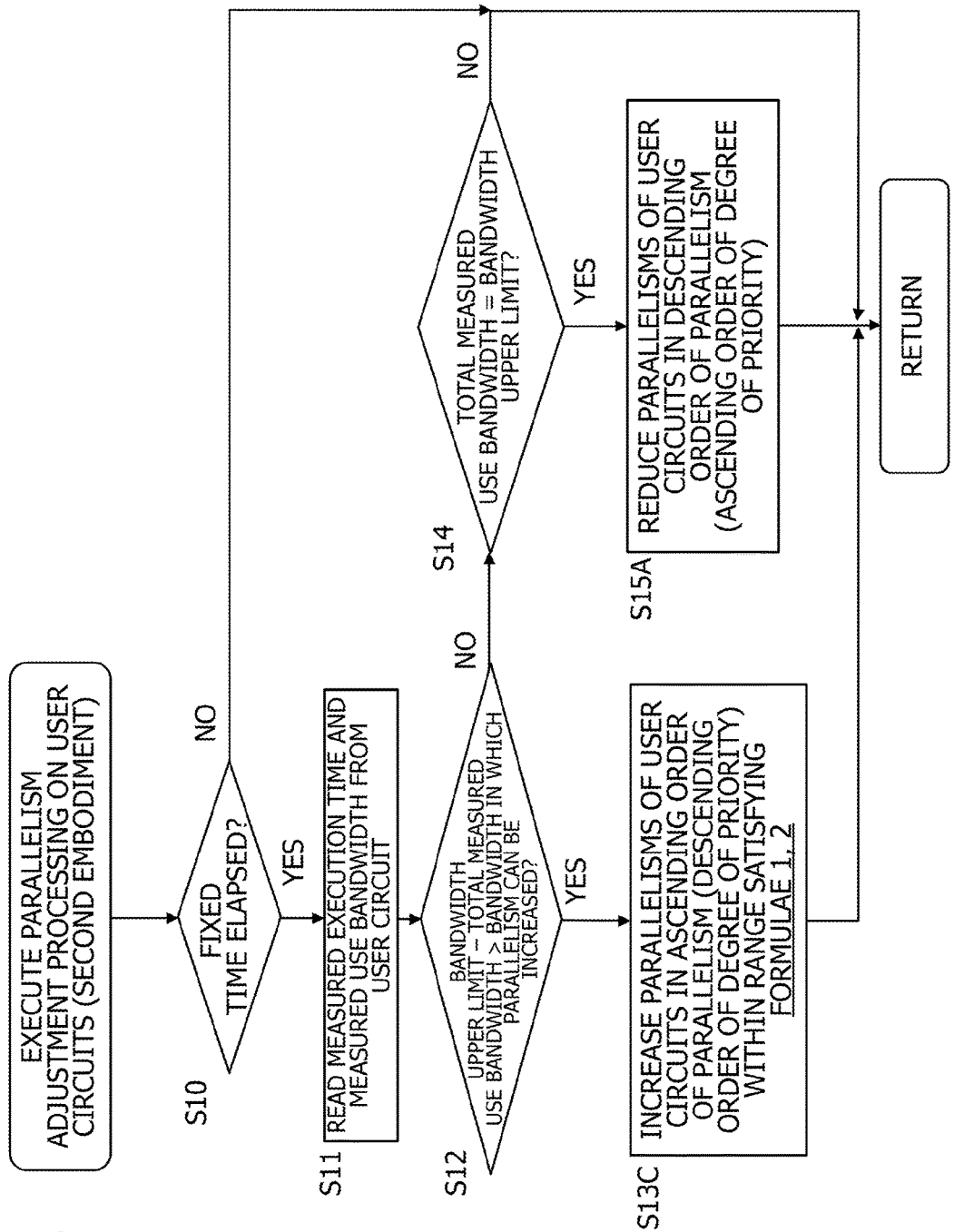
FIG. 17 is a flowchart of parallelism adjustment processing executed on the user circuits according to the second embodiment.

FIG. 17 is a flowchart of parallelism adjustment processing executed on the user circuits according to the second embodiment. In contrast to FIG. 10, which illustrates the parallelism adjustment processing executed on the user circuits according to the first embodiment, the parallelism of a user circuit having a low parallelism is increased preferentially (S13C), and the parallelism of a user circuit having a high parallelism is reduced preferentially (S15A).

Every time the fixed time elapses (YES in S10), the processor obtains the measured execution time and the measured use bandwidth from the measurement circuits of all of the user circuits (S11). The processor then determines whether or not the value obtained by subtracting the total value of the measured use bandwidths from the upper limit of the FPGA bus bandwidth is a large enough bandwidth to be able to increase the parallelism of one of the user circuits (S12).

When the determination of step S12 is affirmative, the processor increases the parallelisms of the respective user circuits in ascending order of the parallelism (assuming a degree of priority is defined to be higher as parallelism is lower, in descending order of the degree of priority of the user circuit) within a range satisfying Formula 1 and Formula 2 (S13C).

Figure 18:
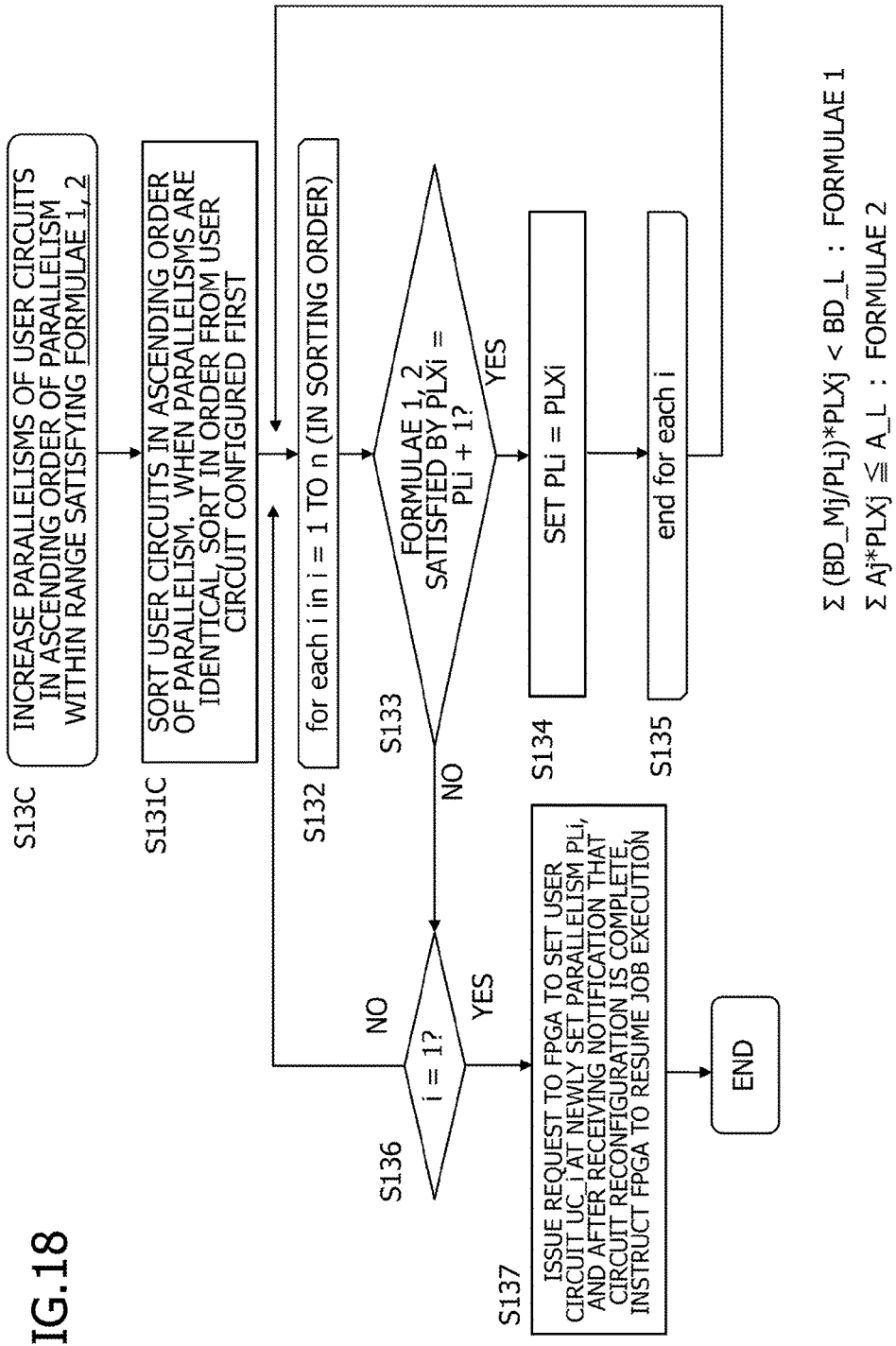
FIG. 18 is a flowchart of step S13C.

FIG. 18 is a flowchart of step S13C. In contrast to the flowchart of FIG. 11, the processor sorts the user circuits in ascending order of the parallelism (S131C). Further, the processor sorts user circuits having the same parallelism in order from the user circuit configured first (S131C). When, in the sorting order, Formula 1 and Formula 2 are satisfied by the new parallelism $PLXi=PLi+1$ for the target user circuit (YES in S133), the processor sets the parallelism PLi at the new parallelism PLXi for the target user circuit (S134). Otherwise, FIG. 18 is identical to FIG. 11. As a result, the degree of priority of a user circuit having a low parallelism can be increased preferentially within a range satisfying Formula 1 and Formula 2.

When, on the other hand, the determination of step S12 in FIG. 17 is negative and the total measured use bandwidth has reached the upper limit of the FPGA bus bandwidth (YES in S14), the processor reduces the parallelisms of the respective user circuits in descending order of the parallelism (assuming the degree of priority is defined to be higher as the parallelism is lower, in ascending order of the degree of priority of the user circuit) (S15A). In this case, the total measured use bandwidth has reached the upper limit of bandwidth, making it impossible to determine whether or not the total measured use bandwidth following parallelism reduction is lower than the upper limit of the FPGA bus bandwidth. Accordingly, the processor reduces the parallelism of the user circuit having the highest parallelism by −1, and then implements the determination of step S14 on the basis of the measured use bandwidth obtained in the next cycle. When the determination of step S14 becomes affirmative again, the processor again reduces the parallelism of the user circuit having the highest parallelism.

When the parallelisms are identical in step S15A, the parallelism of a user circuit configured recently may be reduced preferentially.

As described above, in the parallelism adjustment processing executed on the user circuits according to the second embodiment, parallelism adjustment is implemented such that the parallelisms of all of the user circuits are as uniform as possible. Further, when the parallelisms are identical, the parallelism of a user circuit configured a long time ago is increased preferentially, and the parallelism of a user circuit configured recently is reduced preferentially.

According to the first and second embodiments, as described above, the parallelisms of the user logic circuits configured in the FPGA are increased within a range below the upper limit of the FPGA bus bandwidth. As a result, the parallelisms of the logic circuits of the users can be maximized within a range ensuring that a bottleneck does not occur in the FPGA bus bandwidth while preventing unneeded increases in the parallelisms of the user circuits in the FPGA. Moreover, the FPGA can be used effectively as a CPU accelerator.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An information processing device comprising:
a processor configured to execute a program; and
a programmable circuit device (a PLD hereafter) having
a reconfiguration region in which a logic circuit requested in a configuration request from the processor is configured in response to the configuration request,
wherein the processor:
obtains measured values of data transfer rates of a plurality of logic circuits that are configured in the reconfiguration region and are operating; and
on the basis of a sum of the obtained measured values of the data transfer rates, adjusts respective parallelisms of the plurality of logic circuits configured in the reconfiguration region, within a range ensuring that a sum of the data transfer rates does not exceed an upper limit of a data transfer rate of a bus provided in the PLD.

2. The information processing device according to claim 1, wherein, when the sum of the obtained measured values of the data transfer rates reaches the upper limit, the processor reduces the parallelism of a logic circuit satisfying a first condition, among the plurality of logic circuits that are configured in the reconfiguration region and are operating.

3. The information processing device according to claim 1, wherein, when the sum of the obtained measured values of the data transfer rates does not reach the upper limit value, the processor increases the parallelism of a logic circuit satisfying a second condition, among the plurality of logic circuits that are configured in the reconfiguration region and are operating.

4. The information processing device according to claim 2, wherein the processor:
obtains measured values of execution times required respectively by the plurality of logic circuits that are configured in the reconfiguration region and are operating to complete processing; and
selects a logic circuit having the greatest difference between the measured value of the execution time and a predicted execution time, among the plurality of logic circuits that are configured in the reconfiguration region and are operating, as the logic circuit satisfying the first condition.

5. The information processing device according to claim 2, wherein the processor:
obtains measured values of execution times required respectively by the plurality of logic circuits that are configured in the reconfiguration region and are operating to complete processing; and
selects a logic circuit in which a difference between the measured value of the execution time and a predicted execution time equals or exceeds a predetermined reference value, among the plurality of logic circuits that are configured in the reconfiguration region and are operating, as the logic circuit satisfying the first condition.

6. The information processing device according to claim 2, wherein the processor:
obtains measured values of execution times required respectively by the plurality of logic circuits that are configured in the reconfiguration region and are operating to complete processing; and when reducing the parallelism of the logic circuit, reduces the parallelism of the logic circuit satisfying the first condition in inverse proportion to a ratio of the measured value of the execution time to a predicted execution time of the logic circuit satisfying the first condition.

7. The information processing device according to claim 2, wherein the processor:

obtains measured values of execution times required respectively by the plurality of logic circuits that are configured in the reconfiguration region and are operating to complete processing; and after reducing the parallelism of the logic circuit, obtains measured values of respective operation times of the plurality of logic circuits, and executes control to increase the parallelism of a remaining logic circuit other than the logic circuit whose parallelism is reduced.

8. The information processing device according to claim 2, wherein, when one of the plurality of logic circuits that are configured in the reconfiguration region and are operating finishes executing processing, the processor increases the parallelism of the logic circuit having the reduced parallelism preferentially, within the range ensuring that the sum of the obtained data transfer rates does not exceed the upper limit of the data transfer rate of the bus provided in the PLD.

9. The information processing device according to claim 1, wherein the processor increases the parallelism of a logic circuit having lower parallelism preferentially within the range ensuring that the sum of the data transfer rates does not exceed the upper limit of the data transfer rate of the bus provided in the PLD.

10. The information processing device according to claim 1, wherein the processor reduces the parallelism of a logic circuit having higher parallelism preferentially within the range ensuring that the sum of the data transfer rates does not exceed the upper limit of the data transfer rate of the bus provided in the PLD.

11. The information processing device according to claim 9, wherein the processor reduces the parallelism of a logic circuit having higher parallelism preferentially within the range ensuring that the sum of the data transfer rates does not exceed the upper limit of the data transfer rate of the bus provided in the PLD.

12. A non-transitory computer recording medium that stores therein a programmable circuit device (a PLD hereafter) management program, the PLD having a reconfiguration region in which a logic circuit requested in a configuration request from the processor is configured in response to the configuration request, the PLD management program causing a computer to operate a process comprising:

obtaining measured values of data transfer rates of a plurality of logic circuits that are configured in the reconfiguration region and are operating; and on the basis of a sum of the obtained measured values of the data transfer rates, adjusting respective parallelisms of the plurality of logic circuits configured in the reconfiguration region, within a range ensuring that a sum of the data transfer rates does not exceed an upper limit of a data transfer rate of a bus provided in the PLD.

13. A method of managing a programmable circuit device (a PLD hereafter) that has a reconfiguration region in which a logic circuit requested in a configuration request from the processor is configured in response to the configuration request, the method comprising:

obtaining measured values of data transfer rates of a plurality of logic circuits that are configured in the reconfiguration region and are operating; and on the basis of a sum of the obtained measured values of the data transfer rates, adjusting respective parallelisms of the plurality of logic circuits configured in the reconfiguration region, within a range ensuring that a sum of the data transfer rates does not exceed an upper limit of a data transfer rate of a bus provided in the PLD.

* * * * *